(12) United States Patent
Tsurumaru et al.

(10) Patent No.: US 10,116,296 B2
(45) Date of Patent: Oct. 30, 2018

(54) SEMICONDUCTOR INTEGRATED CIRCUIT DEVICE AND ELECTRONIC DEVICE

(71) Applicant: Renesas Electronics Corporation, Tokyo (JP)

(72) Inventors: Makoto Tsurumaru, Tokyo (JP); Kenta Sadakata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 271 days.

(21) Appl. No.: 15/234,956

(22) Filed: Aug. 11, 2016

(65) Prior Publication Data

US 2017/0093390 A1 Mar. 30, 2017

(30) Foreign Application Priority Data

Sep. 24, 2015 (JP) .................................. 2015-186734

(51) Int. Cl.
*H02H 5/04* (2006.01)
*H03K 17/0812* (2006.01)
*H03K 17/08* (2006.01)

(52) U.S. Cl.
CPC .................. *H03K 17/08128* (2013.01); *H03K 2017/0806* (2013.01)

(58) Field of Classification Search
USPC ........................... 361/86–87, 93.7–93.9, 103
See application file for complete search history.

(56) References Cited

U.S. PATENT DOCUMENTS

| 2014/0375333 A1 | 12/2014 | Minagawa | |
|---|---|---|---|
| 2015/0023076 A1* | 1/2015 | Nakamori | H02M 7/48 363/56.03 |
| 2016/0063834 A1* | 3/2016 | Terasawa | G08B 19/00 340/521 |

* cited by examiner

*Primary Examiner* — Danny Nguyen
(74) *Attorney, Agent, or Firm* — McGinn IP Law Group, PLLC.

(57) ABSTRACT

An electronic device has a power semiconductor device, a first semiconductor integrated circuit device, and a second semiconductor integrated circuit device. The power semiconductor device has a terminal outputting sense current. The first semiconductor integrated circuit device has an overcurrent detection circuit detecting overcurrent on the basis of the sense current, and a temperature detection circuit detecting temperature of the power semiconductor device. The second semiconductor integrated circuit device has a storage device storing a temperature characteristic of a current mirror ratio of the power semiconductor device, a temperature detecting unit calculating temperature on the basis of an output of the temperature detection circuit, and an overcurrent detection control unit controlling the overcurrent detection circuit on the basis of the temperature detected by the temperature detecting unit and the temperature characteristic of the current mirror ratio stored in the storage device.

20 Claims, 24 Drawing Sheets

SEMICONDUCTOR INTEGRATED CIRCUIT DEVICE AND ELECTRONIC DEVICE

CROSS-REFERENCE TO RELATED APPLICATIONS

The disclosure of Japanese Patent Application No. 2015-186734 filed on Sep. 24, 2015 including the specification, drawings and abstract is incorporated herein by reference in its entirety.

BACKGROUND

The present disclosure relates to a semiconductor integrated circuit device and can be applied to, for example, a semiconductor integrated circuit device which drives a power semiconductor device with a current sensing function.

A three-phase inverter circuit as a component of a power converting device has a configuration that two series circuits in each of which six insulated gate bipolar transistors (IGBT) and freewheeling diodes (FWD) are coupled in antiparallel are coupled in parallel to a DC power supply. An inductance load such as an electric motor is coupled to a coupling point between IGBTs of the series circuits. The IGBT used for the power converting device is provided with an overcurrent protection circuit for protecting the IGBT from destruction when overcurrent flows (for example, the specification of U.S. Patent Application Publication No. 2014/0375333). As overcurrent detecting means, a part passing (sense) current dedicated to sensing (current mirror circuit) is provided separately from a part passing main current of the IGBT, the sense current (current mirror current) is detected, and the means is used as main current detecting means. Hereinbelow, a value obtained by dividing the main current value by the sense current value will be called the current mirror ratio.

RELATED ART LITERATURE

Patent Literature

Patent Literature 1
U.S. Patent Application Publication No. 2014/0375333

SUMMARY

Variation in the current mirror ratio is large due to the characteristic of a power semiconductor device such as an IGBT and current detection precision deteriorates.

The other problems and novel features will become apparent from the description of the specification and the appended drawings.

Outline of a representative one in the present disclosure will be briefly described as follows.

A semiconductor integrated circuit device has a circuit correcting variation in a current mirror ratio on the basis of characteristic data of a power semiconductor device.

According to the semiconductor integrated circuit device, precision of current detection can be improved.

DETAILED DESCRIPTION

Figure 1:
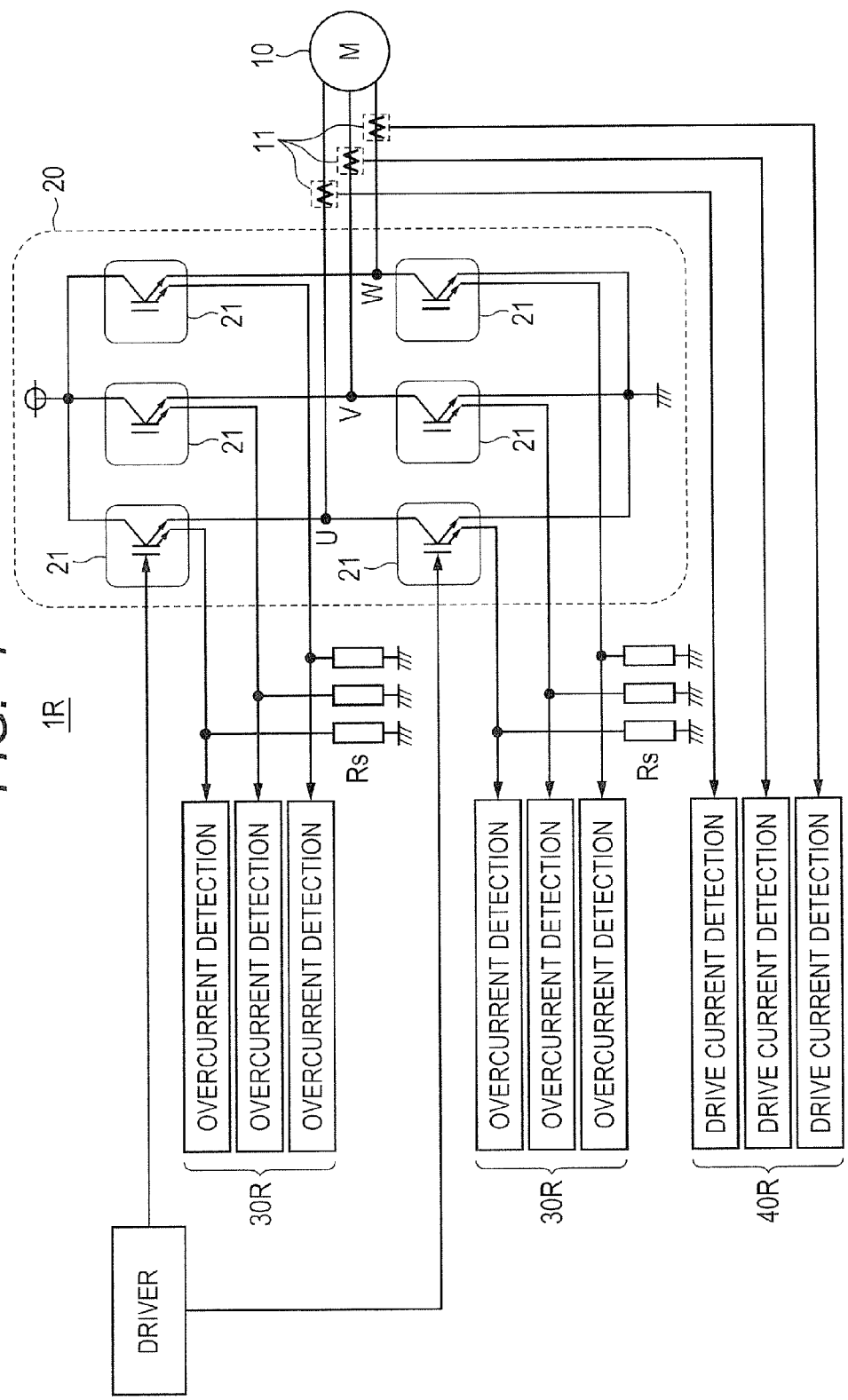
FIG. 1 is a block diagram illustrating a part of an electric motor system according to a comparative example.

Hereinafter, embodiments, examples, and modifications will be described with reference to the drawings. In the following description, the same reference numerals are designated to the same components and, in some cases, repetitive description is omitted.

First, a technique examined by the inventors of the present disclosure (hereinbelow, called comparative example) will be described.

Figure 2:
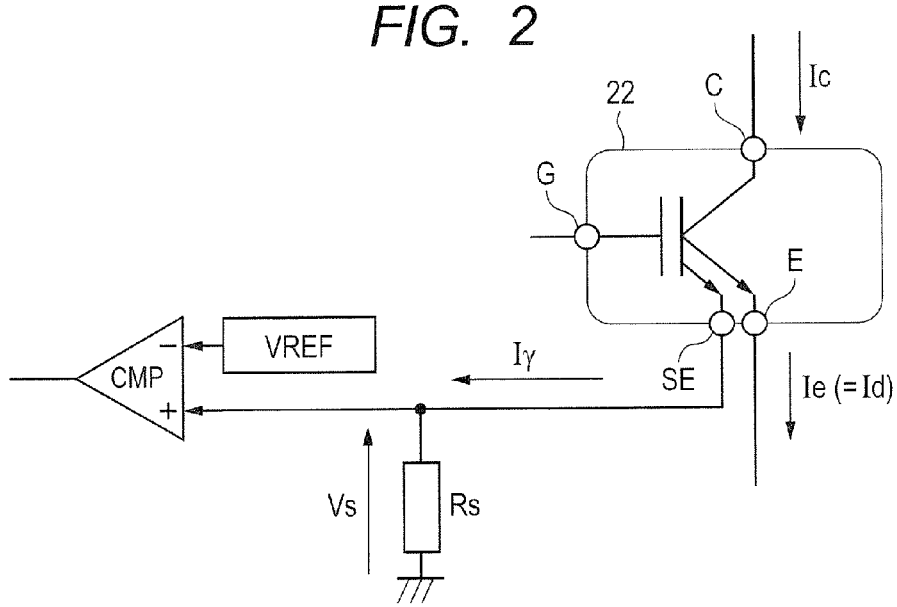
FIG. 2 is a diagram for explaining sense current of an IGBT.

FIG. 1 is a block diagram illustrating a part of an electric motor system related to the comparative example. FIG. 2 is a diagram for explaining sense current of an IGBT. An electric motor system 1R has a three-phase motor 10, an inverter circuit 20, a driver IC 30R, and a control circuit 40R. The three-phase motor 10 has three current transformers (coils) 11. When two phase currents are detected, the current of each phase can be calculated, so that the number of current transformers may be two. The inverter circuit 20 has a three-phase bridge configuration by six power semiconductor devices 21. As illustrated in FIG. 2, the power semiconductor device 21 has an IGBT 22 as a switching transistor, and the IGBT 22 has a gate terminal G, a collector terminal C, an emitter terminal E passing drive current, and a current detection terminal SE passing sense current. The driver IC 30R drives the power semiconductor device 21, and the control circuit 40R controls the driver IC 30R.

In the inverter circuit using the IBGT 22, to perform motor driving, a drive signal (PWM signal) driving the IBGT 22 has to be controlled while monitoring drive current. The following two currents are monitored.

(1) The motor drive current of each phase is monitored by using the current transformer 11, an A/D converter of the control circuit 40R or the like and used as normal current detection for motor drive control.

(2) The sense current is monitored by using a voltage comparison circuit, an A/D converter, or the like in the driver IC 30R and used for overcurrent detection to interrupt the drive signal at the time of overcurrent.

The drive current (Id) of the IGBT 22 is emitter current (Ie). Since the sense current is current of a current mirror circuit in the IGBT 22, it is also called a current mirror current (Iγ). The ratio (Ie/Iγ) between the emitter current (Ie) and the current mirror current (Iγ) is also called a current mirror ratio (γ). The current mirror ratio is selected from about 1000 to 10000. When the normal current drive (Id) of the motor is about 400 A, rated current is about 1600 A.

Overcurrent can be detected by converting the current mirror current (Iγ) to voltage (Vs) by a current detection resistor (resistance value (Rs)) and comparing the voltage with a reference voltage (VREF) by a comparator (CMP). When the precision of the resistance value (Rs) of the current detection resistor is within ±1%, the detection voltage (Vs) is expressed by the following equation (1).

$$Vs = I\gamma \times Rs \quad (1)$$
$$= Ie \times (1/\gamma) \times Rs$$
$$= Id \times (1/\gamma) \times Rs$$

Therefore, in the case of using the sense current for determining abnormality exceeding the rated current value, when it is assumed that the current mirror ratio (γ) is 4000 and the resistance value (Rs) of the current detection resistor is 5Ω, the detection voltage (Vs) in the overcurrent detection is as follows.

$$Vs = 1600A \times (1/4000) \times 5\Omega = 2V$$

When the reference voltage (VREF) is set to 2V and the rated current value flows as the drive current of the motor, the comparator (CMP) detects overcurrent.

Next, variations in the current mirror ratio will be described below.

Figure 3:
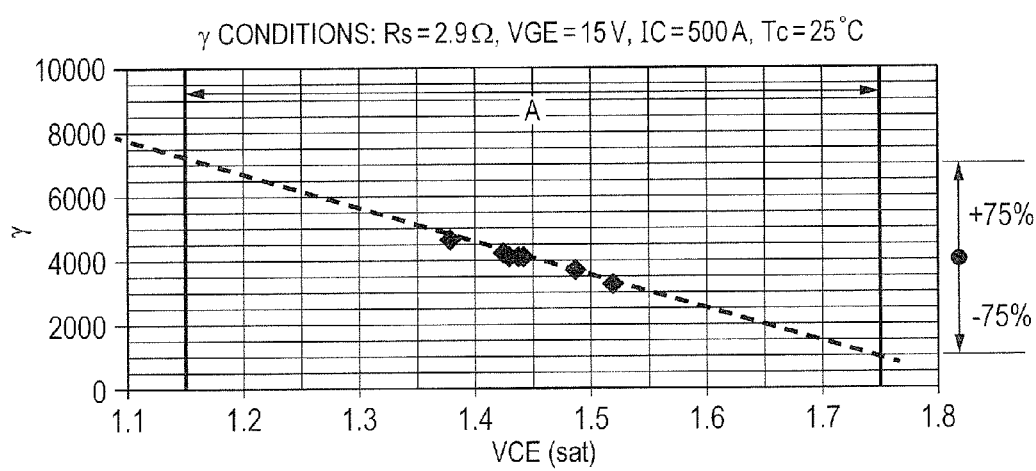
FIG. 3 is a diagram illustrating the relation between a current mirror ratio of the IGBT and saturation voltage between the collector and the emitter.

FIG. 3 is a diagram illustrating the relation between the current mirror ratio of the IGBT and saturation voltage between the collector and the emitter. The conditions are that ambient temperature (Tc)=25° C., gate-emitter voltage (VGE)=15V, detection resistance (Rs)=2.9Ω, and collector current (IC)=500 A. In a variation range (A=1.15 to 1.75V) of the saturation voltage (VCE (sat)) between the collector and the emitter, the current mirror ratio (γ) varies ±75% of 4000. When all of the conditions (Tc=−40 to 175° C., VGE=14 to 18V, Rs=2.9Ω, and IC=500 A) are assumed, the current mirror ratio (γ) becomes very high value like −75%/140% of 4000 and does not lie within ±10% of 4000.

Figure 4:
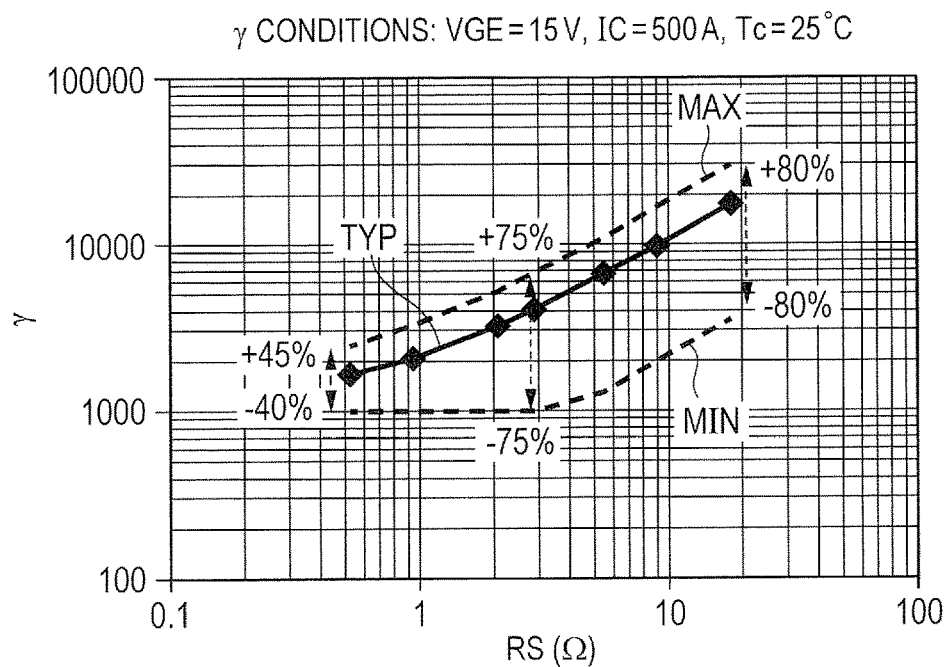
FIG. 4 is a diagram illustrating the relation between the current mirror ratio of the IGBT and a current detection resistor.

FIG. 4 is a diagram illustrating the relation between the current mirror ratio of the IGBT and resistance for current detection. The conditions are Tc=25° C., VGE=15V, and IC=500 A. The current mirror ratio (γ) varies like ±75% at Rs=2.9Ω, −40%/45% at Rs=0.5Ω, and ±80% at Rs=20Ω. There is a tendency that the smaller Rs is, the higher the precision is.

Figure 5:
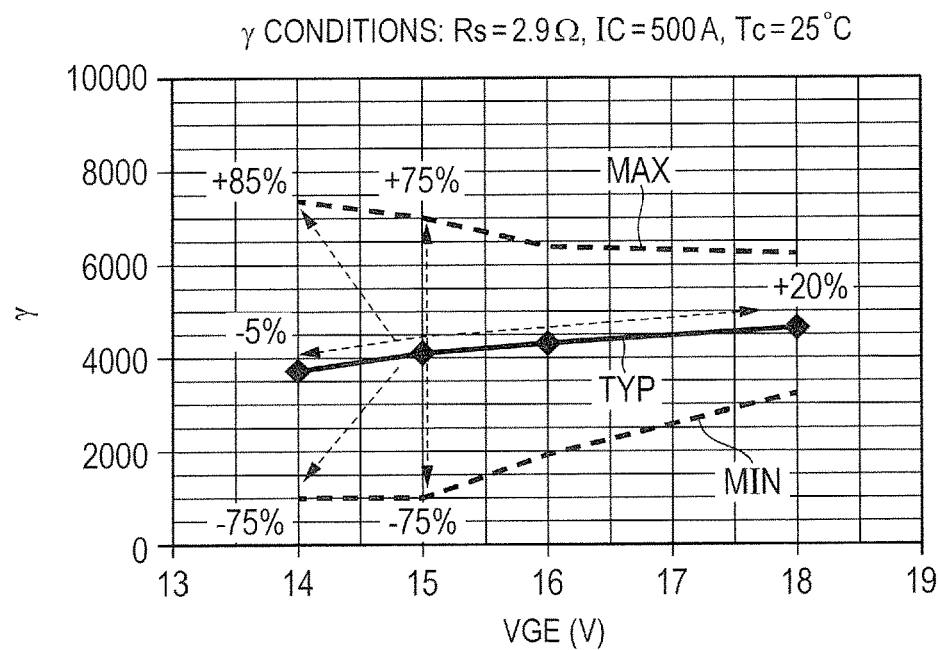
FIG. 5 is a diagram illustrating the relation between the current mirror ratio of the IGBT and the voltage between the gate and the emitter.

FIG. 5 is a diagram illustrating the relation between the current mirror ratio of the IGBT and the saturation voltage between the gate and the emitter. The conditions are Tc=25° C., Rs=2.9Ω, and IC=500 A. The current mirror ratio (γ) varies like ±75% at VG=15V, −75%/75% at VG=14V, and ±−20%/50% at VG=18V. There is a tendency that the larger VGE is, the higher the precision is.

Figure 6:
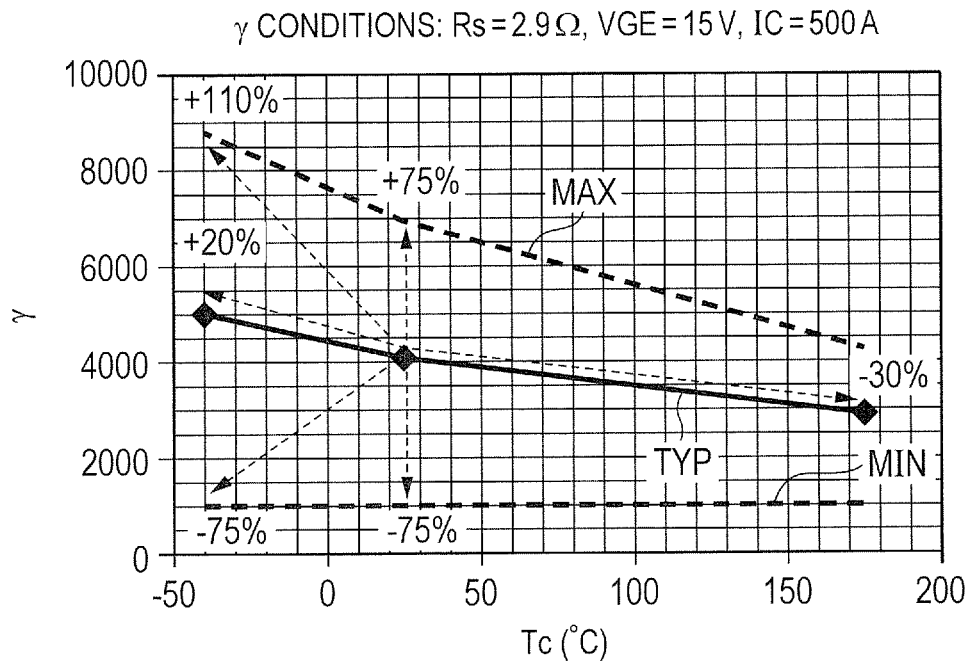
FIG. 6 is a diagram illustrating the relation between the current mirror ratio of the IGBT and temperature.

FIG. 6 is a diagram illustrating the relation between the current mirror ratio of the IGBT and temperature. The conditions are Rs=2.9Ω, VGE=15V, and IC=500 A. The current mirror ratio (γ) varies like ±75% at Tc=25° C., −75%/110% at Tc=−40° C., and −75%/5% at Tc=175° C. When all of the temperatures (−40 to 175° C.) are considered, the precision of −75%/110% (25° C. reference) is estimated.

Figure 7:
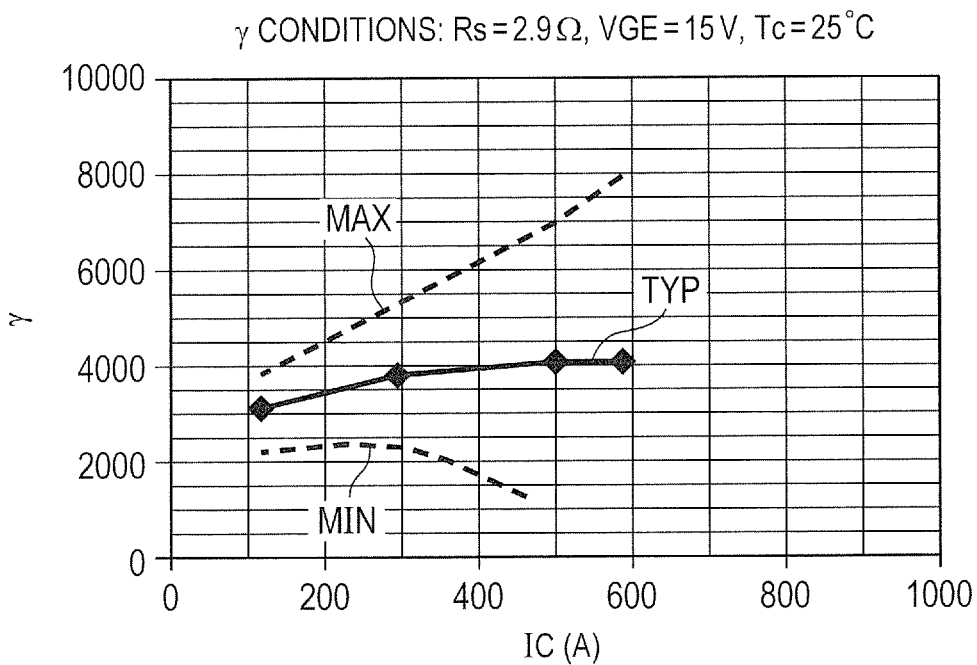
FIG. 7 is a diagram illustrating the relation between the current mirror ratio of the IGBT and collector current.

FIG. 7 is a diagram illustrating the relation between the current mirror ratio of the IGBT and collector current. The conditions are Rs=2.9Ω, VGE=15V, and Tc=25° C. The current mirror ratio (γ) varies like ±75% at IC=500 A, −50%/0% at IC=100V, and −90%/100% at IC=600 A. There is a tendency that the larger IC is, the higher the precision is.

As described above, due to the characteristics of the IGBT, the variation in the current mirror ratio is large. For example, the temperature characteristic of the detection voltage (Vs) is as follows.

$$Vs=1600A \times (1/4000) \times 5\Omega = 2V \ldots \text{ at ordinary temperature}$$

$$Vs=1600A \times (1/3000) \times 5\Omega = 2.67V \ldots \text{ at high temperature (150° C.)}$$

$$Vs=1600A \times (1/5000) \times 5\Omega = 1.6V \ldots \text{ at low temperature (−45° C.)}$$

When the reference voltage (VREF) of the comparator (CMP) is the same as the voltage at ordinary temperature, at high temperature, overcurrent is detected at small current. At low temperature, even the current becomes larger than rated current, overcurrent cannot be detected and current detection precision deteriorates. As a result, variation occurs in detection current detection time at the time of detecting overcurrent, a delay occurs in the following protection measure. In the worst case, the device is destroyed. Consequently, each resistance value of a current detection resistor has to be adjusted in a board including an IGBT in actual inverter design environment and a device with small variation has to be selected.

Embodiments

Figure 27:
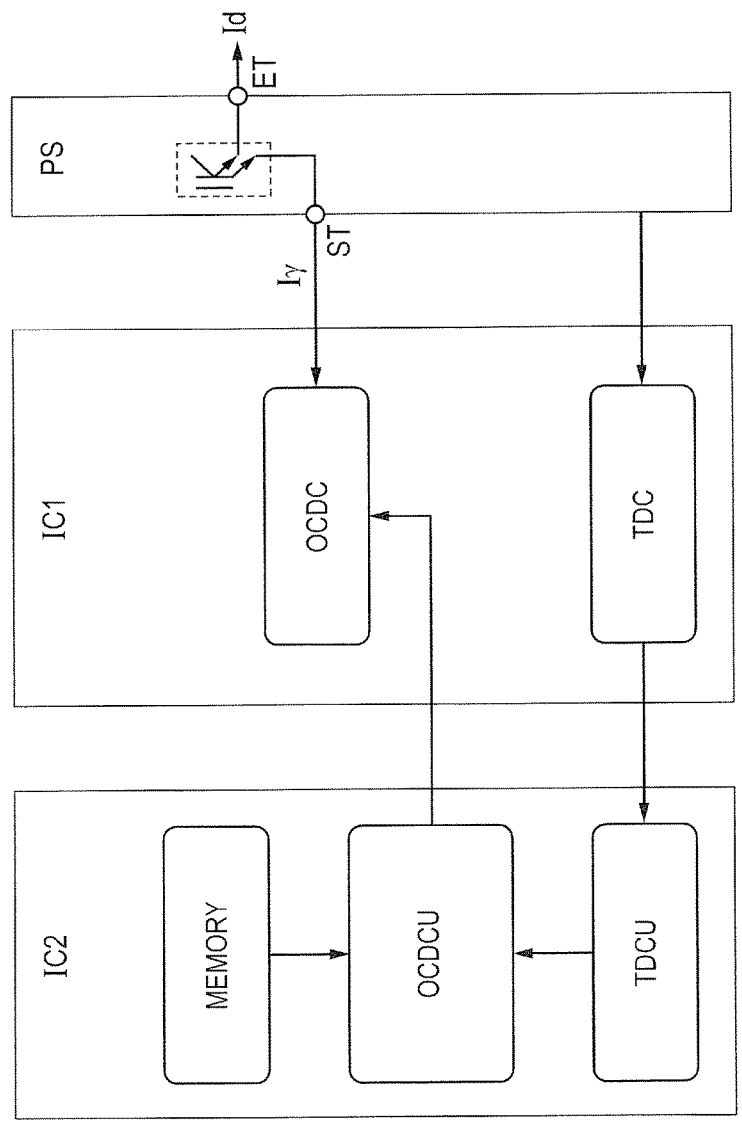
FIG. 27 is a block diagram illustrating the configuration of an electronic device according to an embodiment.

FIG. 27 is a block diagram illustrating the configuration of an electronic device according to an embodiment.

An electronic device according to an embodiment includes a power semiconductor device (PS), a first semiconductor integrated circuit device (IC1) driving the power semiconductor device (PS), and a second semiconductor integrated circuit device (IC2) controlling the first semiconductor integrated circuit device (IC1). The power semiconductor device (PS) has a terminal (ST) outputting sense current (Iγ). The first semiconductor integrated circuit device (IC1) has an overcurrent detection circuit (OCDC) detecting overcurrent on the basis of the sense current (Iγ) and a temperature detection circuit (TDC) detecting temperature of the power semiconductor device (OS). The second semiconductor integrated circuit device (IC2) has a memory device (MEM) storing the temperature characteristic of the current mirror ratio of the power semiconductor device (PS), a temperature detection unit (TDU) calculating temperature on the basis of an output of the temperature detection circuit (TDC), and an overcurrent detection control unit (OCDCU) controlling the overcurrent detection circuit (OCDC) on the basis of the temperature detected by the temperature detection unit (TDU) and the temperature characteristic of the current mirror ratio stored in the memory device (MEM).

For example, the overcurrent detection circuit (OCDC) converts the current mirror current (Iγ) to voltage (Vs) by the current detection resistor (resistance value (Rs)), detects overcurrent by comparing the reference voltage (VREF) and the voltage (Vs) and makes reference voltage (VREF) changeable on the basis of the temperature characteristic data of the current mirror ratio (γ) of the power semiconductor device. In a first embodiment, the temperature characteristic data of the current mirror ratio (γ) of the power semiconductor device or information to obtain the data is held in the power semiconductor device itself. In a second embodiment, the temperature characteristic data of the current mirror ratio (γ) of the power semiconductor device is measured, and the temperature characteristic data of the current mirror ratio (γ) is stored in a semiconductor integrated circuit device which is different from the semiconductor integrated circuit device detecting overcurrent.

Figure 28:
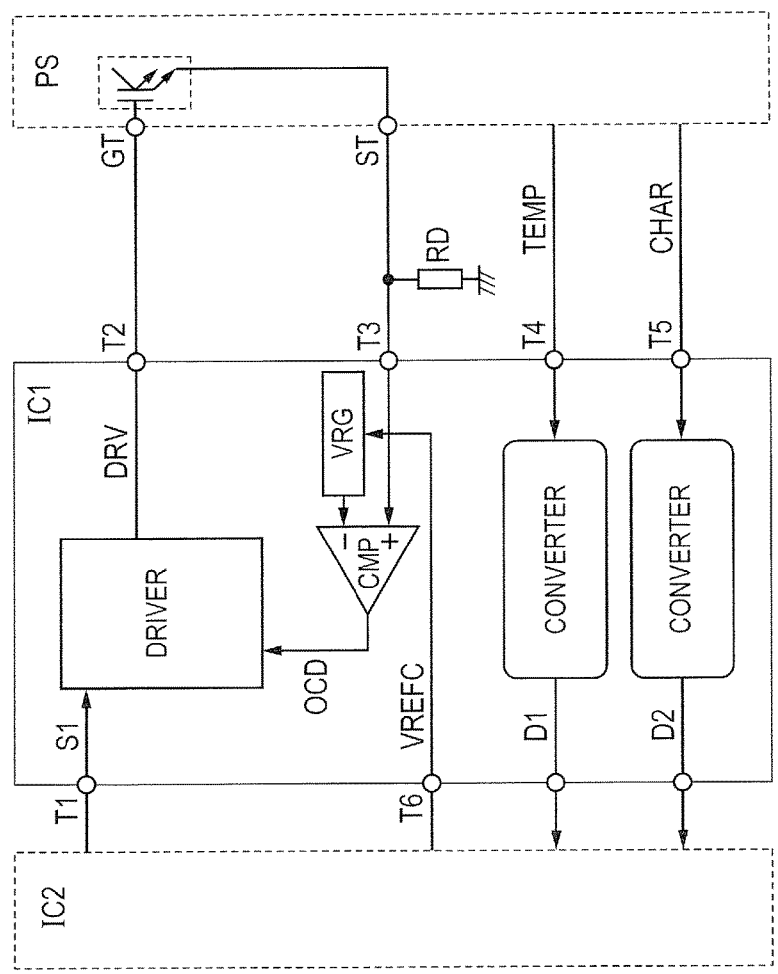
FIG. 28 is a block diagram illustrating the configuration of a semiconductor integrated circuit device according to a first embodiment.

The first embodiment of the first semiconductor integrated circuit device (IC1) of the electronic device according to the embodiment will be described. FIG. 28 is a block diagram for explaining a semiconductor integrated circuit device according to the first embodiment.

The semiconductor integrated circuit device (IC1) according to the first embodiment has a first terminal (T1) for inputting a signal (S1) from another semiconductor integrated circuit device (IC2), a second terminal (T2) to be coupled to a gate terminal (GT) of a power semiconductor device (PS), and a third terminal (T3) to be coupled to a sense current terminal (ST) of the power semiconductor device (PS) and a current detection resistor (RD). The semiconductor integrated circuit device (IC1) has a comparator (CMP) coupled to the third terminal, a reference voltage generation circuit (VRG) coupled to the comparator (CMP), and a drive circuit (DRIVER) outputting a drive signal (DRV) based on the signal (S1) and an output signal (OCD) of the comparator (CMP) to the second terminal (T2). The semiconductor integrated circuit device (IC1) has a fourth terminal (T4) for inputting temperature information (TEMP) of the power semiconductor device (PS), a fifth terminal (T5) for inputting information (CHAR) regarding the temperature characteristic of the current mirror ratio of the power semiconductor device (PS) from the power semiconductor device (PS), and a conversion circuit converting the temperature information (TEMP) to first data (D1). The semiconductor integrated circuit device (IC1) has a conversion circuit converting the information (CHAR) regarding the temperature characteristic of the current mirror ratio to second data (D2) and a sixth terminal (T6) for inputting information (VREFC) controlling the voltage of the reference voltage generation circuit (VRG) based on the first data (D1) and the second data (D2).

Figure 29:
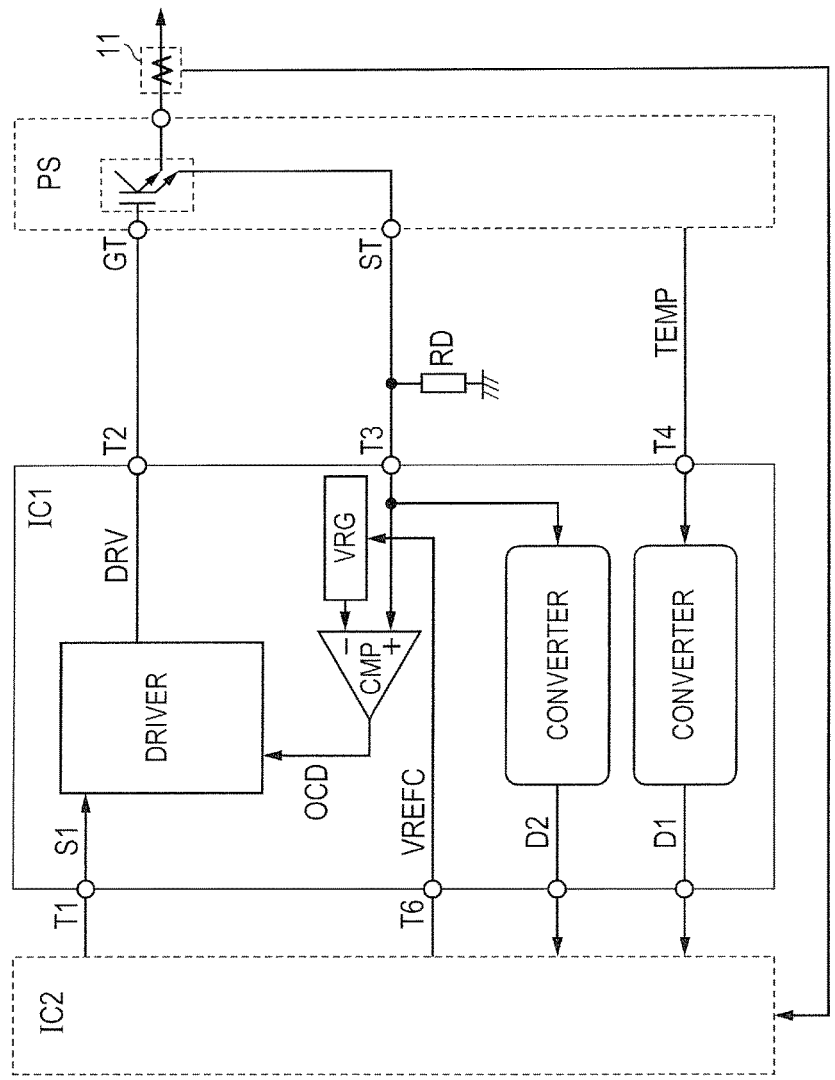
FIG. 29 is a block diagram illustrating the configuration of a semiconductor integrated circuit device according to a second embodiment.

A second embodiment of a first semiconductor integrated circuit device (IC1) of the electronic device according to the embodiment will be described. FIG. 29 is a block diagram for explaining a semiconductor integrated circuit device according to a second embodiment.

The semiconductor integrated circuit device (IC1) according to the second embodiment has a first terminal (T1) for inputting a signal (S1) from another semiconductor integrated circuit device (IC2), a second terminal (T2) to be coupled to a gate terminal (GT) of a power semiconductor device (PS), and a third terminal (T3) to be coupled to a sense current terminal (ST) of the power semiconductor device (PS) and a current detection resistor (RD). The semiconductor integrated circuit device (IC1) also has a comparator (CMP) coupled to the third terminal, a reference voltage generation circuit (VRG) coupled to the comparator (CMP), and a drive circuit (DRIVER) outputting a drive signal (DRV) based on the signal (S1) and an output (OCD) of the comparator (CMP) to the second terminal (T2). The semiconductor integrated circuit device (IC1) also has a fourth terminal (T4) for inputting temperature information (TEMP) of the power semiconductor device (PS), a conversion circuit converting the temperature information (TEMP) to the first data (D1), a conversion circuit converting the voltage (Vs) of the third terminal (T3) to second data (D2), and a sixth terminal (T6) for inputting information (VREFC) controlling the voltage of the reference voltage generation circuit (VRG) based on the first data (D1), the second data (D2) and data of a current transformer detecting drive current as output of the power semiconductor device (PS).

According to the embodiments, the overcurrent detection circuit can be controlled on the basis of the temperature characteristic of the current mirror ratio. Consequently, even the current mirror ratio varies relative to the temperature, overcurrent can be detected with high precision. According to the first embodiment, the information regarding the temperature characteristic of the current mirror ratio can be obtained from the power semiconductor device, and the reference voltage can be changed on the basis of the information regarding the temperature character of the current mirror ratio and the temperature information of the power semiconductor device. According to the second embodiment, the temperature characteristic of the current mirror ratio can be measured, and the reference voltage can be changed on the basis of the temperature characteristic of the current mirror ratio and the temperature information of the power semiconductor device. From the above, even if the current mirror ratio varies relative to the temperature, the overcurrent can be detected with high precision.

When the overcurrent can be detected with high precision, in an abnormal current occurrence mode such as a load short-circuit state, the operation can be moved to a power device (power semiconductor device) protecting operation with high precision at high speed. As a result, destruction tolerance design of the power device is optimized, and the electric characteristic of the power device can be improved.

First Example

Figure 8:
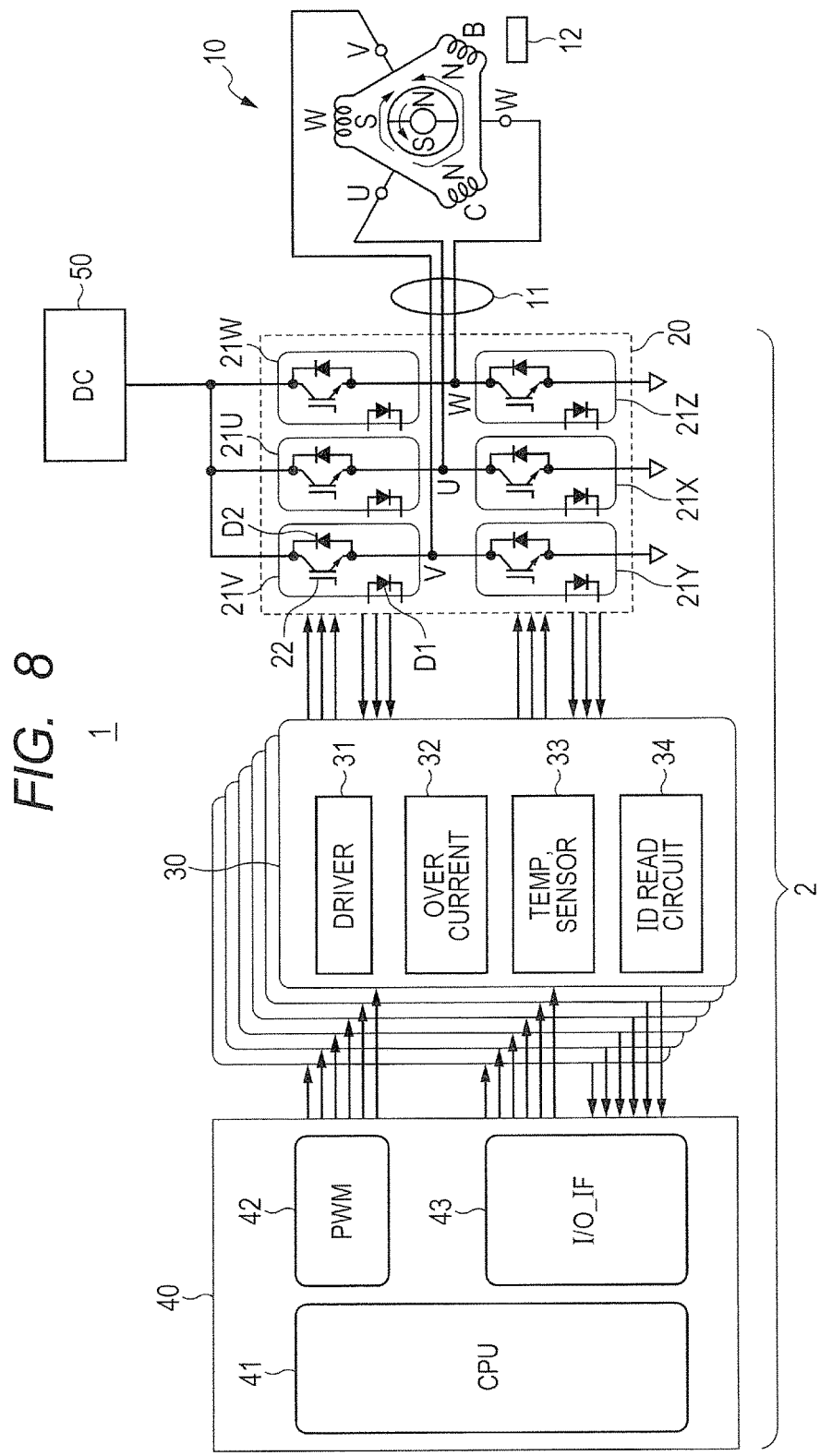
FIG. 8 is a block diagram illustrating the configuration of an electric motor system according to a first example.

In a first example (example 1) of the first embodiment, information for obtaining temperature characteristic data of the current mirror ratio (γ) of the power semiconductor device is held in the power semiconductor device itself.
Electric Motor System FIG. 8 is a block diagram illustrating the configuration of an electric motor system related to a first example. An electric motor system 1 has a three-phase motor 10, an inverter circuit 20 using six power semiconductor devices, six driver ICs 30, a control circuit 40, and a DC power supply 50. The inverter circuit 20 is also called a power module. A part comprised of the inverter circuit 20, the six driver ICs 30, and the control circuit 40 is called an electronic device 2. The inverter circuit 20 on/off-controls a switching transistor 22 in the inverter circuit 20 so as to pass current to each of the phases of the three-phase motor 10 from the voltage of the DC power supply (DC) 50 at the time of driving a vehicle or the like to change the speed of a vehicle or the like by the frequency of the switching. At the time of braking of a vehicle or the like, the inverter circuit 20 on/off-controls the switching transistor 22 synchronously with the voltage generated in each of the phases of the three-phase motor 10, performs so-called rectifying operation, converts the voltage to DC voltage, and performs regeneration.

In the three-phase motor 10, a rotor is a permanent magnet, an armature is a coil, and winding wires of the armatures of three phases (U phase, V phase, and W phase) are disposed at intervals of 120 degrees. The coils are delta-connected, and current always flows in the three coils of the U phase, V phase, and W phase. The three-phase motor 10 has a current detector 11 such as a current transformer and an angular velocity and position detector 12.

In the inverter circuit 20, bridge circuits of the U phase, V phase, and W phase are comprised of power semiconductor devices. In the bridge circuit of the U phase, a connection point between power semiconductor devices 21U and 21X is coupled to the three-phase motor 10. In the bridge circuit of the V phase, a connection point between power semiconductor devices 21V and 21Y is coupled to the three-phase motor 10. In the bridge circuit of the W phase, a connection point between power semiconductor devices 21W and 21Z is coupled to the three-phase motor 10. Since the configurations of the power semiconductor devices 21U, 21V, 21W, 21X, 21Y, and 21Z are the same, in some cases, the devices are collectively called the power semiconductor devices 21. The power semiconductor device 21 is comprised of a semiconductor chip having the switching transistor (hereinbelow, called IGBT) 22 comprised of an IGBT and a temperature detection diode D1 and a semiconductor chip having a freewheeling diode (FWD) D2 coupled in parallel between the emitter and the collector of the IGBT 22. The freewheeling diode D2 is coupled so as to pass current in the direction opposite to the current flowing in the IGBT 22. The semiconductor chip in which the IGBT 22 and the temperature detection diode D1 are formed and the semiconductor chip in which the freewheeling diode D2 is formed are preferably put in the same package. The freewheeling diode D2 may be formed in the same semiconductor chip as the semiconductor chip in which the IGBT 22 and the temperature detection diode D1 are formed.

Figure 9:
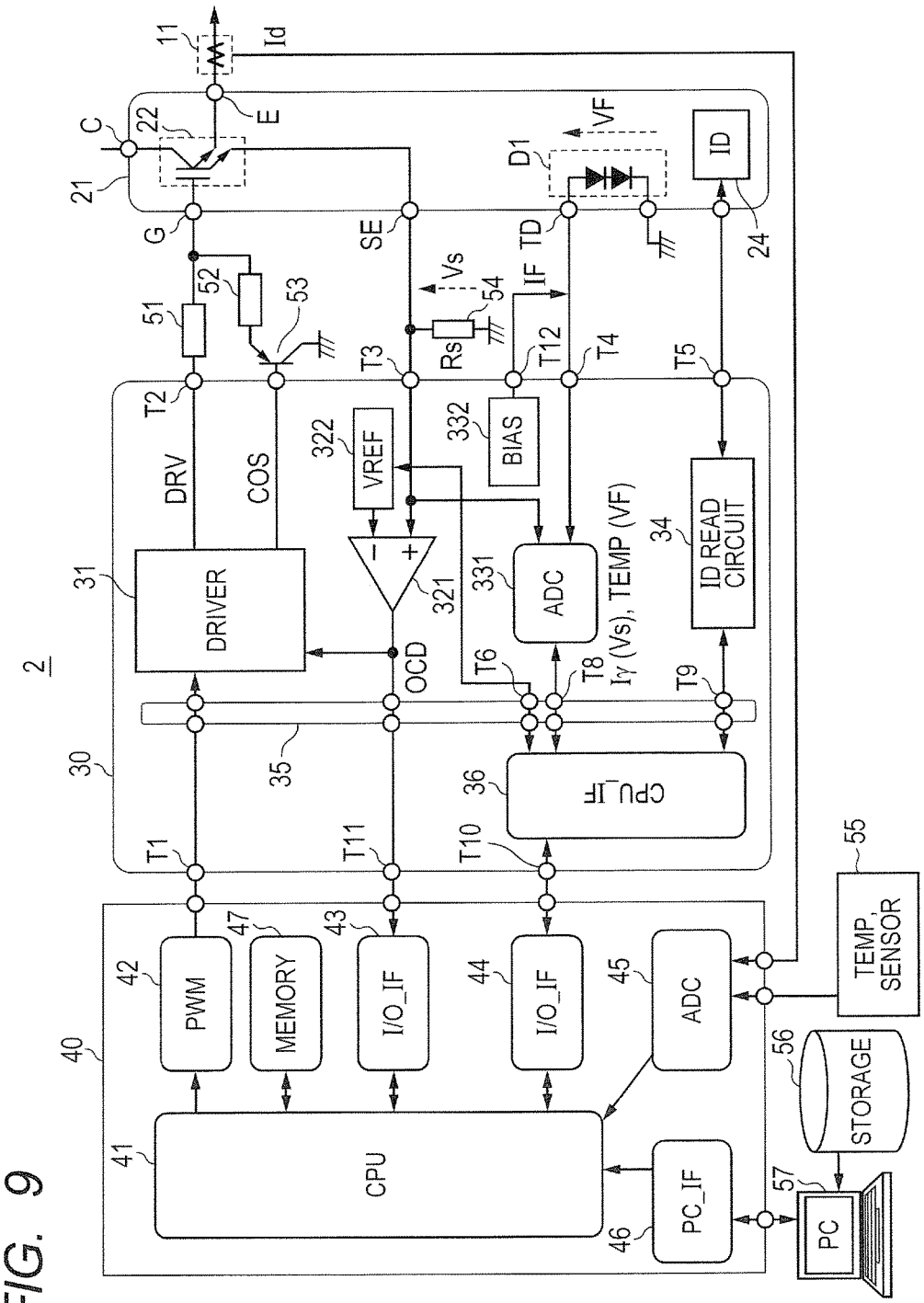
FIG. 9 is a block diagram illustrating the configuration of an electronic device as a part of the electric motor system of FIG. 8.

The driver IC 30 as the first semiconductor integrated circuit device has, in one semiconductor board, a drive circuit (DRIVER) 31 generating a signal which drives the gate of the IGBT 22, an overcurrent detection circuit (OVER CURRENT) 32, a temperature detection circuit (TEMP. DETECT) 33, and an ID read circuit (ID READ CIRCUIT) 34. The control circuit 40 as the second semiconductor integrated circuit device has, in one semiconductor board, a CPU 41, a PWM circuit (PWM) 42, and an I/O interface (I/O IF) 43.
Electronic Device FIG. 9 is a block diagram illustrating the electronic device as a part of the electric motor system of FIG. 8. The power semiconductor device 21 has, over one semiconductor board, the IGBT 22 as a switching transistor, the temperature detection diode D1, and an ID circuit (ID CIRCUIT) 24 storing an ID code unique to the chip. The power semiconductor device 21 has a gate terminal G, a collector terminal C, an emitter terminal E passing drive current, and a current detection terminal SE passing sense current. The ID circuit 24 is comprised of a ladder resistor, an electric fuse, and the like. In a wafer test at the time of manufacturing a wafer of the power semiconductor device 21, an ordinary-temperature test and a high-temperature test are executed. Characteristic data (temperature characteristic of the current mirror ratio (γ) of the power semiconductor device 21 obtained at the tests is stored together with an ID code as a wafer measurement data library into a storage device 56. The ID code is set, for example, by disconnecting the electric fuse in the ID circuit 24 in the power semiconductor device 21 at the time of the wafer test.

The driver IC 30 has the drive circuit 31, the current detection circuit 32, the temperature detection circuit 33, the ID read circuit 34, an isolator 35, and a CPU interface (CPU_IF) circuit 36. The drive circuit 31 generates a drive signal (DRV) driving the gate electrode to turn on/off the IGBT 22 on the basis of a PWM (Pulse Width Modulation) signal which is supplied via the terminal T1 from the control circuit 40 and outputs it to the terminal T2. A resistor 51 is provided between the terminal T2 of the drive circuit 31 and the gate terminal G of the IGBT 22. The drive circuit 31 sets the drive signal (DRV) to the low level on the basis of an overcurrent detection signal (OCD) which will be described later, outputs a cutoff signal (COS), and turns on a cutoff transistor 53 to set the potential between the resistor 51 and the gate terminal G of the IGBT 22 to the low level. A resistor 52 is arranged between the cutoff transistor 53 and the gate terminal G.

The current detection circuit 32 has a comparator 321 and a reference voltage generation circuit 322. The current detection circuit 32 converts the sense current to detection voltage (Vs) by a current detection resistor 54 coupled to the terminal T3 and compares the detection voltage (Vs) with a reference voltage (VREF) of the reference voltage generation circuit 322 to detect overcurrent. When the detection voltage (Vs) is larger than the reference voltage (VREF), the current detection circuit 32 sends an overcurrent detection signal (OCD) to the drive circuit 31 to interrupt the drive signal to the IGBT 22 and also sends the signal to the CPU 41 via the isolator 35, the terminal T11, and the I/O interface 43 of the control circuit 40. An A/D conversion circuit 331 which will be described later converts the detection voltage (Vs) and sends the converted voltage to the CPU 41 via a terminal T8, the isolator 35, the CPU interface 36, a terminal T10, and an I/O interface 44 of the control circuit 40. The reference voltage (VREF) of the reference voltage generation circuit 322 can be changed by a signal supplied from a terminal T6.

The temperature detection circuit 33 has the A/D conversion circuit 331 as a circuit detecting a forward voltage (VF) of the temperature detection diode D1 and a current bias circuit (BIAS) 332 supplying bias current to the temperature detection diode D1. The chip temperature of the power semiconductor device 21 is measured by using the forward voltage of the temperature detection diode D1. The temperature detection circuit 33 passes constant current (IF) to the temperature detection diode D1 from the current bias circuit 332 via a terminal T12 and a terminal (anode terminal of the temperature detection diode) TD, converts the detection voltage (VF) by the A/D conversion circuit 331, and sends the converted voltage to the CPU 41 via the terminal T8, the isolator 35, the CPU interface 36, the terminal T10, and the I/O interface 44 of the control circuit 40.

The ID read circuit 34 reads the ID code of the ID circuit 24 via a terminal T5 and sends it to the CPU 41 via a terminal T9, the isolator 35, the CPU interface 36, the terminal 10, and the I/O interface 44 of the control circuit 40. The ID read circuit 34 is comprised of an A/D conversion circuit or the like.

The isolator 35 transmits a signal transferred between the driver IC 30 and the control circuit 40 by magnetic coupling. The isolator 35 is comprised of insulating an on-chip transformer formed by wiring by an interlayer film.

The CPU interface 36 is an interface for coupling the circuits in the driver IC 30 and the CPU 41 of the control circuit 40 by an SPI (Serial Peripheral Interface) or the like.

The control circuit 40 has, over one semiconductor board, the CPU 41, the PWM circuit (PWM) 42, a memory device (MEMORY) 47, the I/O interface (I/O_IF) 44 as an interface input/output unit to external devices, an A/D converter (ADC) 45, and a PC interface (PC_IF) 46 as an interface unit to an external PC (Personal Computer) and is comprised of, for example, a microcomputer unit (MCU). Preferably, the memory device 47 is comprised of an electrically rewritable nonvolatile memory such as a flash memory. A program to be executed by the CPU 41 is preferably stored in an electrically rewritable nonvolatile memory such as a flash memory and may be stored in the memory device 47.

The program to be executed by the CPU 41 may be stored in the nonvolatile memory in the control circuit 40 at any of the following timings.
(1) At the time of manufacturing a wafer of the control circuit 40 as the second semiconductor integrated circuit device
(2) After being put in the package of the control circuit 40 and before mounting on the print board of the electronic device 2
(3) After mounting on the print board of the electronic device 2 (the program is stored from a PC 57 via the PC interface 46).

Figure 10:
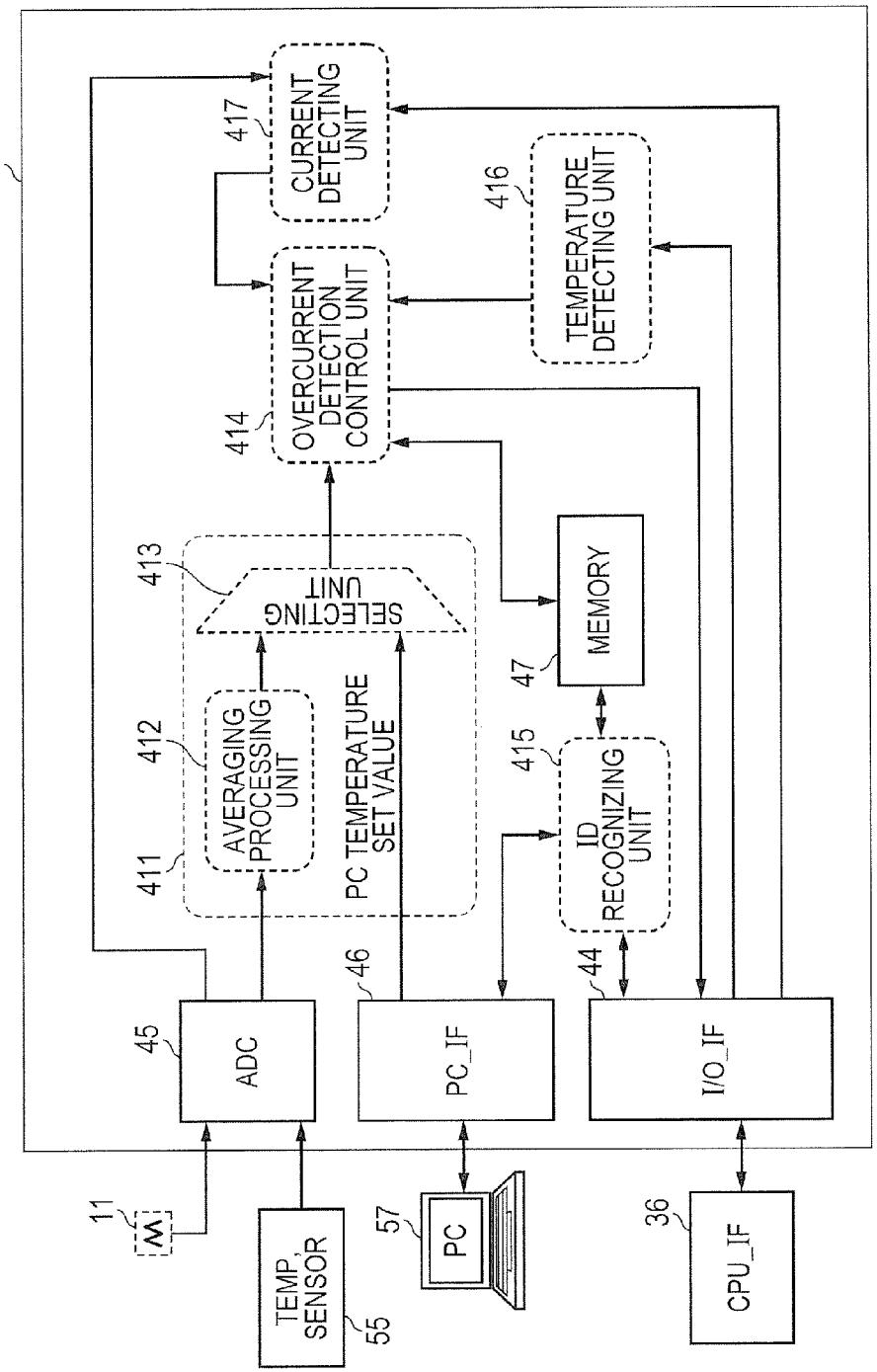
FIG. 10 is a block diagram illustrating functions of a control circuit in FIG. 9.

FIG. 10 is a block diagram illustrating functions of the control circuit in FIG. 9. The control circuit 40 has an outside-air-temperature detecting unit 411, an overcurrent detection control unit 414, a temperature detecting unit 416, and a current detecting unit 417. The control unit 40 has a PWM control unit generating a drive signal which on/off controls the switching transistor of the power semiconductor device in accordance with the torque and rotational speed of a not-illustrated motor. A block indicated by a broken line expresses processes of software (processes that the CPU 41 executes the program). However, the invention is not limited to the software. For example, the block may be comprised of hardware.

The outside temperature detecting unit 411 is comprised of an averaging processing unit 412 and a selecting unit 413. An output of an outside-air-temperature detector 55 as a temperature sensor such as a thermistor is converted by the A/D converter 45. A signal obtained by sampling a plurality of input signals and averaging them by the averaging processing unit 413 and eliminating noise from the resultant signal or a temperature set value of ambient temperature input from the PC 57 via the PC interface 46 is selected by the selecting unit 413. As will be described later, temperature setting of space in which the ambient temperature of the electronic device 2 can be set such as a thermostat bath, or the temperature set value is obtained by the PC 57, so that the PC 57 can supply the set value of the ambient temperature to the control circuit 40. Since it is sufficient to detect the ambient temperature by either the outside-air-temperature detector 55 or the PC 57, one of the outside-air-temperature detector 55 and the PC 57 may not be provided. In this case, the selecting unit 413 in the outside-air-temperature detecting unit 411 may not be provided. In the case of detecting the ambient temperature by the PC 57, the averaging processing unit 412 may not be provided.

Temperature information as an output of the selecting unit 413 and voltage information of the temperature detection diode obtained by converting an output of the A/D conversion circuit 331 by the temperature detecting unit 416 is supplied to the overcurrent detection control unit 414. An ID recognizing unit 415 recognizes the ID code on the basis of a signal from the ID read circuit, obtains a device characteristic corresponding to the ID code from the outside storage device (STORAGE) 56 in which the wafer measurement data library of the PC 57 is stored, and stores it into the memory device 47. The ID recognizing unit 415 stores the obtained device characteristic corresponding to the ID code into the memory device 47. The current detecting unit 417 receives a value corresponding to the drive current (Id) obtained by converting the output of the current transformer 11 by the A/D converter 45 and a value corresponding to the current mirror current (Iγ) obtained by converting the detection voltage (Vs) by the A/D conversion circuit 331.

Method of Manufacturing Electronic Device

Figure 11:
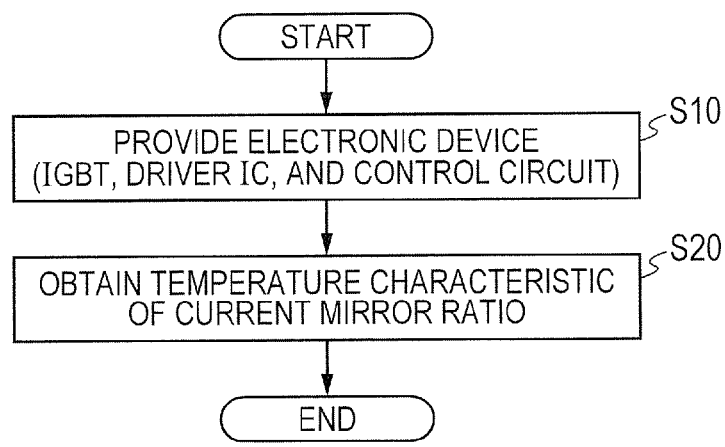
FIG. 11 is a flowchart illustrating a method of manufacturing the electronic device of FIG. 9.
Figure 12:
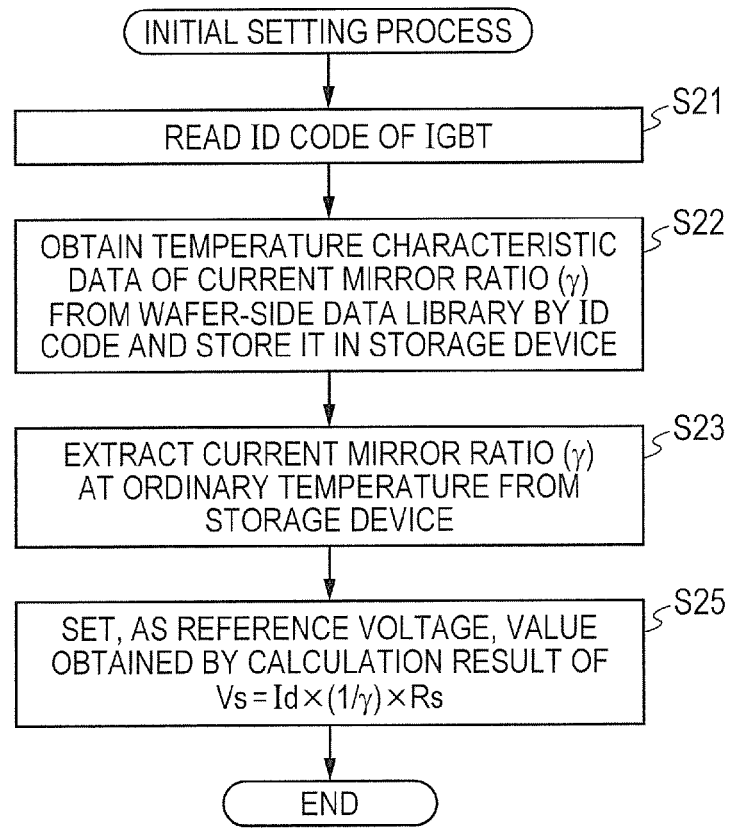
FIG. 12 is a flowchart illustrating an initial setting process at the time of manufacturing the electronic device of FIG. 9.

A method of obtaining temperature characteristic data of the current mirror ratio (γ) as a process of a method of manufacturing the electronic device 2 will be described with reference to FIGS. 11 to 14. FIG. 11 is a diagram for explaining a method of manufacturing the electronic device according to the first example. FIG. 12 is a flowchart of an initial setting process at the time of manufacturing the electronic device according to the first example.

As illustrated in FIG. 11, a process of storing temperature characteristic data of the current mirror ratio (γ) is performed in a test process or the like in the process of manufacturing the electronic device. The electronic device 2 having the power semiconductor device 21, the driver IC 30, and the control circuit 40 is provided (step S10). The electronic device 2 is carried into a space in which the ambient temperature can be set such as a thermostat bath and the outside-air-temperature detector 55 and the PC 57 are coupled. By a method which will be described later, the temperature characteristic of the current mirror ratio (γ) is obtained (step S20). The outside-air-temperature detector 55 and the PC 57 are detached from the electronic device 2 and carried out from the space in which the ambient temperature can be set.

As illustrated in FIG. 12, first, the ID recognizing unit 415 reads the ID code of the power semiconductor device 21 (step S21). Next, the ID recognizing unit 415 obtains the temperature characteristic data of the current mirror ratio ($\gamma$) from the outside storage device 56 in which the wafer measurement data library is stored by the ID code and stores it into the memory device 47 (step S22). The overcurrent detection control unit 414 sets a voltage value obtained by a calculation result of the equation (1) in the reference voltage generation circuit 322 (step S25).

The above-described initial setting process is applied to all (six) of driver ICs corresponding to all (six) of power semiconductor devices configuring the electronic device 2.

Operation at the Time of Normal Operation

Next, the operation at the time of the normal operation (at the time of motor driving) of the electronic device (electric motor system) will be described with reference to FIGS. 13 and 14. Although the outside-air-temperature detector 55 and the PC 57 are necessary to obtain the temperature characteristic data of the current mirror ratio ($\gamma$), they are not necessary in the normal operation time.

Figure 13:
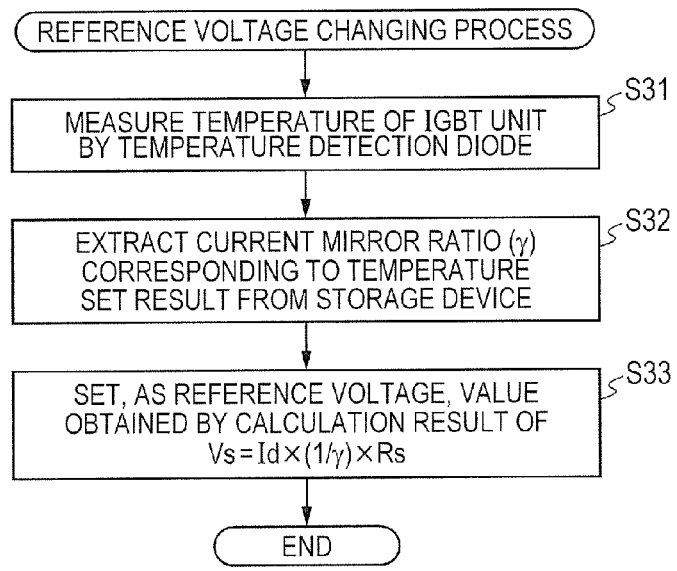
FIG. 13 is a flowchart illustrating reference voltage changing process in the normal operation of the electronic device of FIG. 9.
Figure 14:
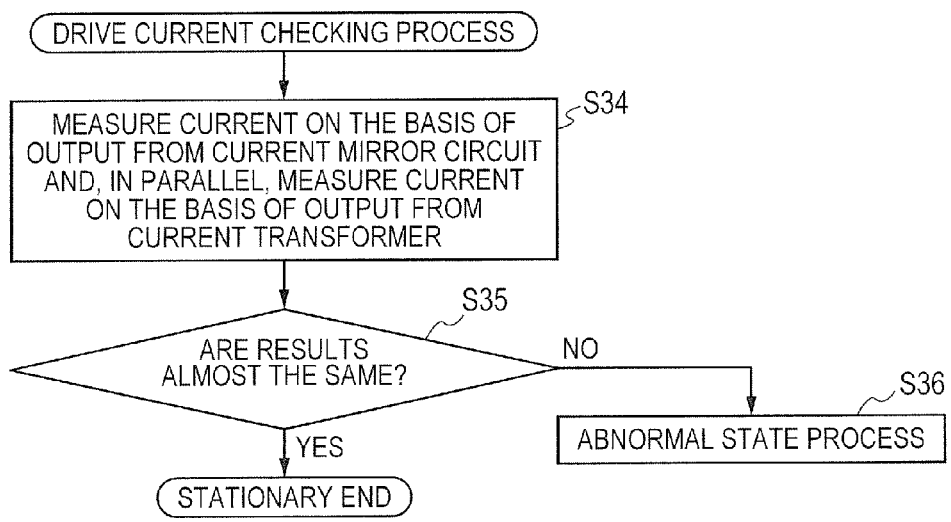
FIG. 14 is a flowchart illustrating drive current checking process in the normal operation of the electronic device of FIG. 9.

FIG. 13 is a flowchart illustrating reference voltage changing process at the time of the normal operation of the control circuit according to the first example. FIG. 14 is a flowchart illustrating drive current checking process at the time of the normal operation of the control circuit according to the first example.

By the temperature detection diode D1, the temperature of the power semiconductor device 21 is measured (step S31). The temperature detecting unit 416 converts voltage information obtained by converting detection voltage (VF) detected by passing the constant current (IF) from the current bias circuit 332 in the driver IC 30 to the temperature detection diode D1 by the A/D conversion circuit 331 to measure the temperature of the power semiconductor device. The overcurrent detection control unit 414 extracts the current mirror ratio ($\gamma$) corresponding to the temperature measurement result obtained by the temperature detecting unit 416 from the memory device 47 (step S32). The overcurrent detection control unit 414 sets the voltage value obtained by the calculation result of the equation (1) in the reference voltage generation circuit 322 (step S33). The above-described reference voltage changing process is executed in regular cycles (for example, 10 ms to 100 ms).

The current detecting unit 417 performs, in parallel, current measurement based on the current mirror current (I$\gamma$) from the sense current terminal SE of the power semiconductor device and current measurement based on the drive current (Id) from the current transformer 11 (step S34). Whether the measured current based on I$\gamma$ and the measurement current based on Id are almost the same or not is measured (step S35). The determination is performed so that, for example, differential data accumulation in specific time does not exceed a predetermined value. In the case of NO, the process moves to step S36. In the case of YES, the process is finished. In step S36, an abnormal state process of stopping or suppressing a drive signal is performed. Even in the case where the current mirror current and the drive current are not in a predetermined range and overcurrent cannot be detected, the power semiconductor device can be protected.

According to the first example, the ID code is stored in the power semiconductor device, the temperature characteristic of the current mirror ratio of the memory device in the control circuit is stored from the wafer measurement data library corresponding to the ID code, and the overcurrent detection circuit can be controlled on the basis of the temperature characteristic of the current mirror ratio. Consequently, even when the current mirror ratio varies relative to the temperature, overcurrent can be detected with high precision.

First Modification

Temperature measurement of the power semiconductor device can be performed without using the on-chip temperature detection diode. In a first modification (modification 1) of the first example, a thermistor is mounted in a power module having the power semiconductor device, and the temperature measurement is performed.

Figure 15:
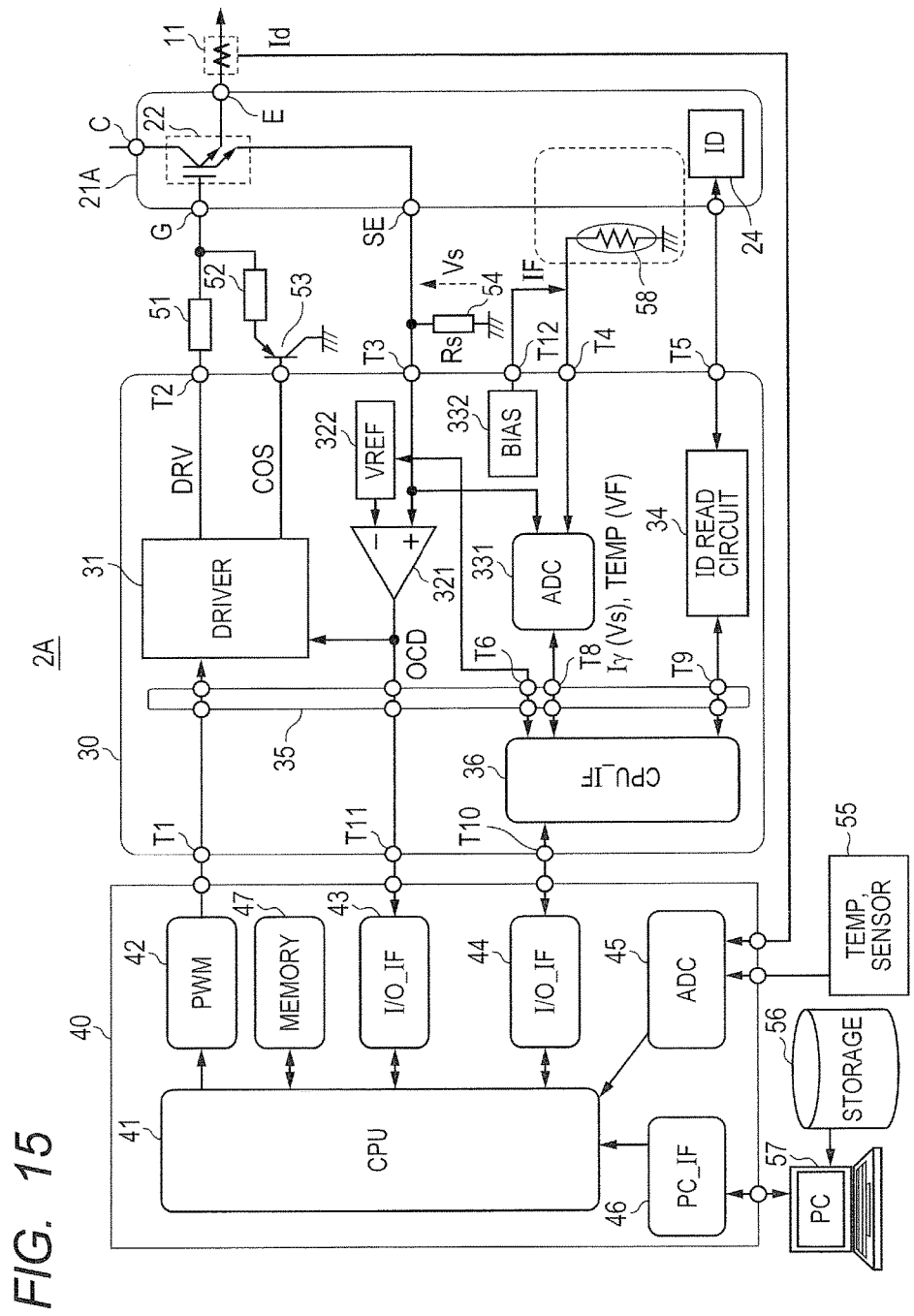
FIG. 15 is a block diagram illustrating the configuration of an electronic device according to a first modification.

FIG. 15 is a block diagram illustrating the configuration of an electronic device according to the first modification. An electronic device 2A of the first modification is similar to the electronic device of the first example except for a power semiconductor device. A temperature detection diode is not provided in a power semiconductor device 21A. Accordingly, a thermistor 58 is mounted in a power module having the power semiconductor device 21A, and one end of the thermistor 58 is coupled to a terminal T4 of the driver IC 30. The power semiconductor device 21A is similar to the power semiconductor device of the first example except that the temperature detection diode is not provided internally.

Figure 16:
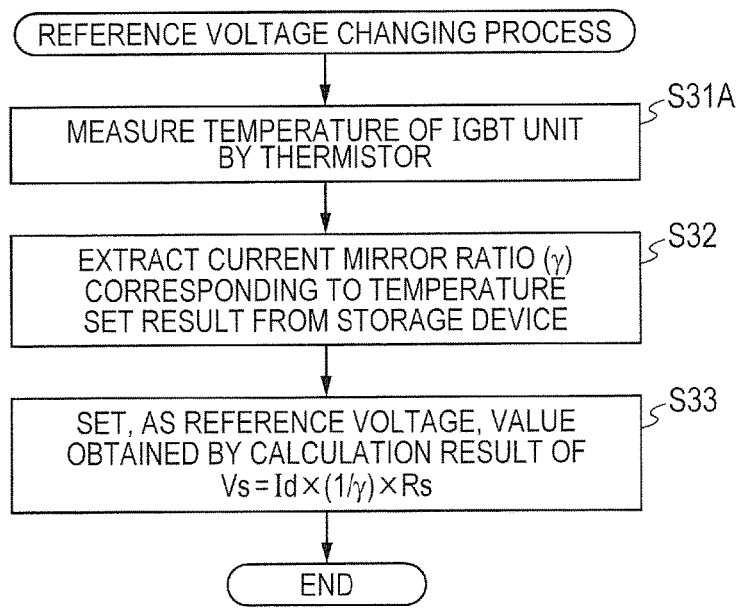
FIG. 16 is a flowchart illustrating reference voltage changing process in the normal operation of the electronic device of FIG. 15.

FIG. 16 is a flowchart of reference voltage changing process at the time of the normal operation of the electronic device of the first modification. The reference voltage changing process at the time of operation of the electronic device of the first modification is similar to that of the first example except that the thermistor is used for temperature measurement. The initial setting process at the time of manufacturing and the drive current checking process at the time of normal operation of the first modification are similar to those of the first example.

In the first modification, it is unnecessary to provide the temperature detection diode in each power semiconductor device. Consequently, even in the case where there is a limitation in a mounting condition such as a limitation in the number of bonding wires per power semiconductor device, the temperature detection can be performed.

Second Modification

There is a case that the current mirror ratio ($\gamma$) at the time of ordinary temperature of the power semiconductor device is different from the current mirror ratio ($\gamma$) of the design reference value. Consequently, in a second modification (modification 2) of the first example, in the initial setting process, the current mirror ratio ($\gamma$) is measured and the gate drive voltage is controlled so that the measured current mirror ratio ($\gamma$) becomes the same as the current mirror ratio ($\gamma$) of the design reference value.

Figure 17:
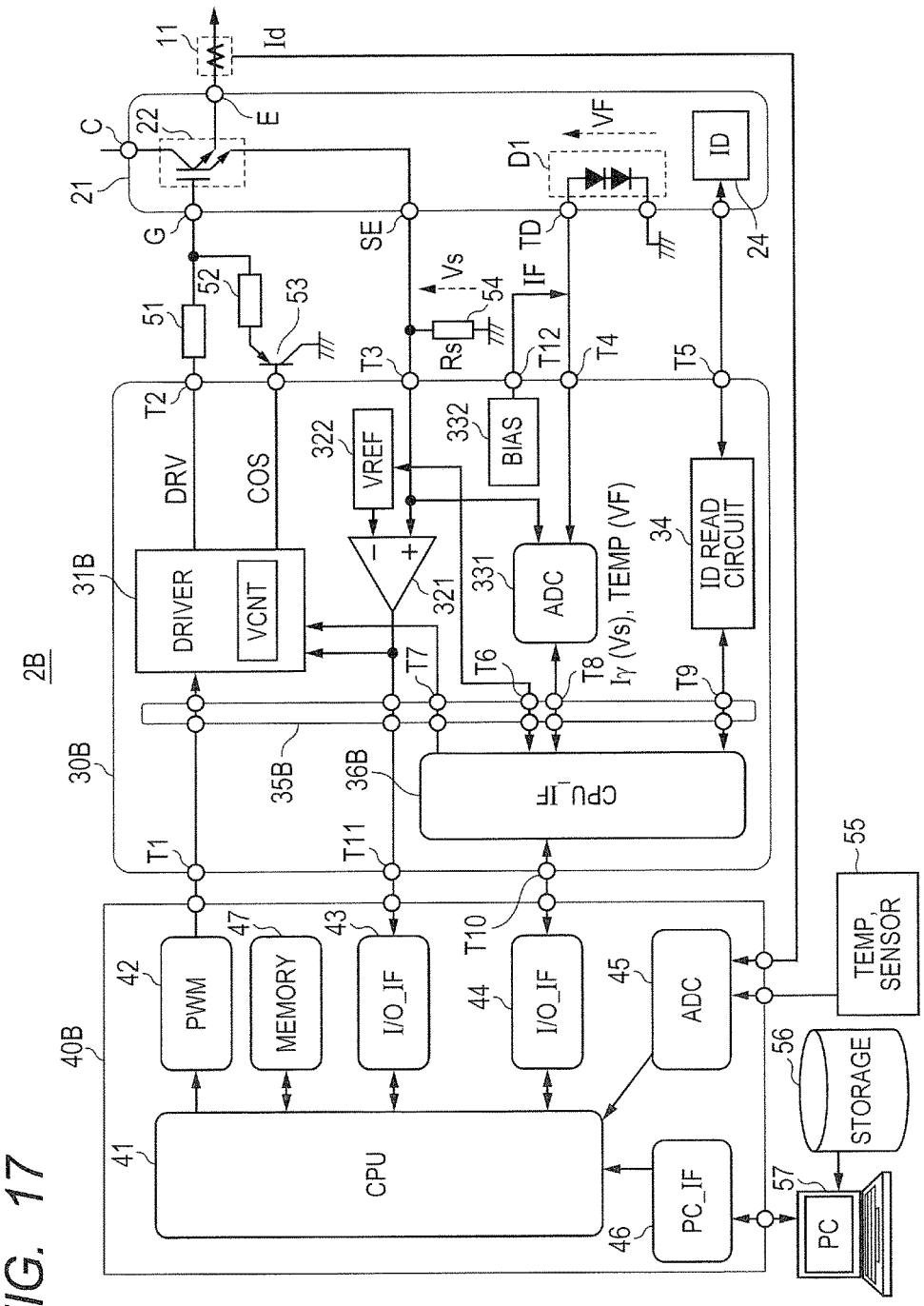
FIG. 17 is a block diagram illustrating the configuration of an electronic device according to a second modification.
Figure 18:
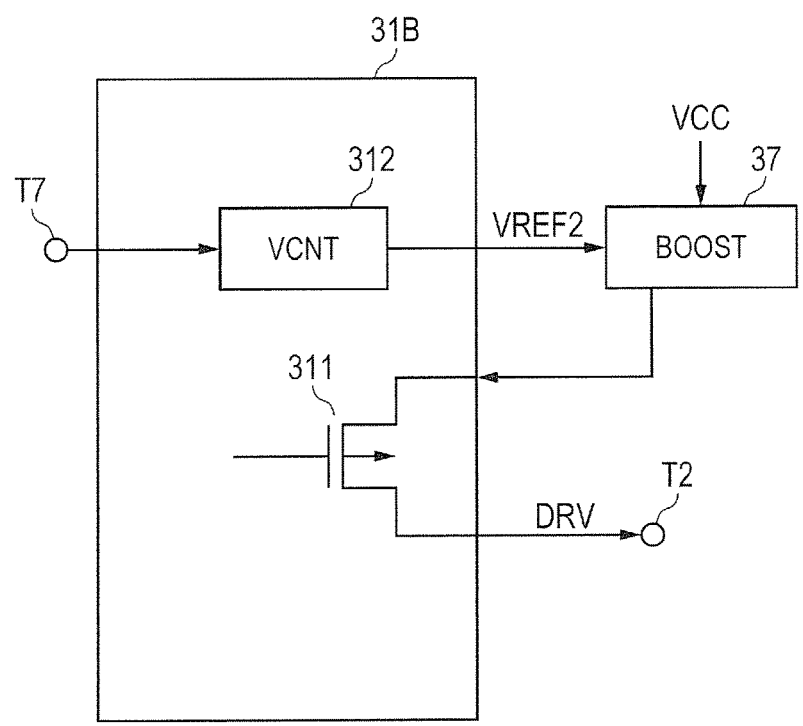
FIG. 18 is a block diagram illustrating the configuration of a drive circuit in FIG. 17.

FIG. 17 is a block diagram illustrating the configuration of an electronic device according to the second modification. FIG. 18 is a block diagram illustrating the configuration of a drive circuit in FIG. 17. The electronic device according to the second modification is similar to that of the first example except for the drive circuit of the driver IC and the control. The point different from the first example will be mainly described.

An electronic device 2B has the power semiconductor device 21, a driver IC 30B, and a control circuit 40B. The driver IC 30B has a drive circuit 31B, an isolator 35B, and a CPU interface 36B. The drive circuit 31B has a drive transistor 311 and a drive voltage control circuit (VCNT) 312. By controlling the voltage of a boost circuit 37 positioned on the outside of the drive circuit 31B by the drive voltage control circuit 312, the drive voltage of the drive transistor 311 is changed. When it is desired to increase the current mirror ratio (γ), the output voltage of the boost circuit 37 is increased. On the contrary, when it is desired to decrease the current mirror ratio (γ), the voltage of the boost circuit 37 is decreased. By the operations, the drive voltage can be adjusted. A signal controlling the drive voltage control circuit 312 is supplied from the CPU 41 via the I/O interface 44, the terminal T10, the CPU interface 36B, the isolator 35B, and a terminal T7. The isolator 35B and the CPU interface 36B have configurations similar to those of the isolator 35 and the CPU interface 36 except for the number of input/output signal lines.

Figure 19:
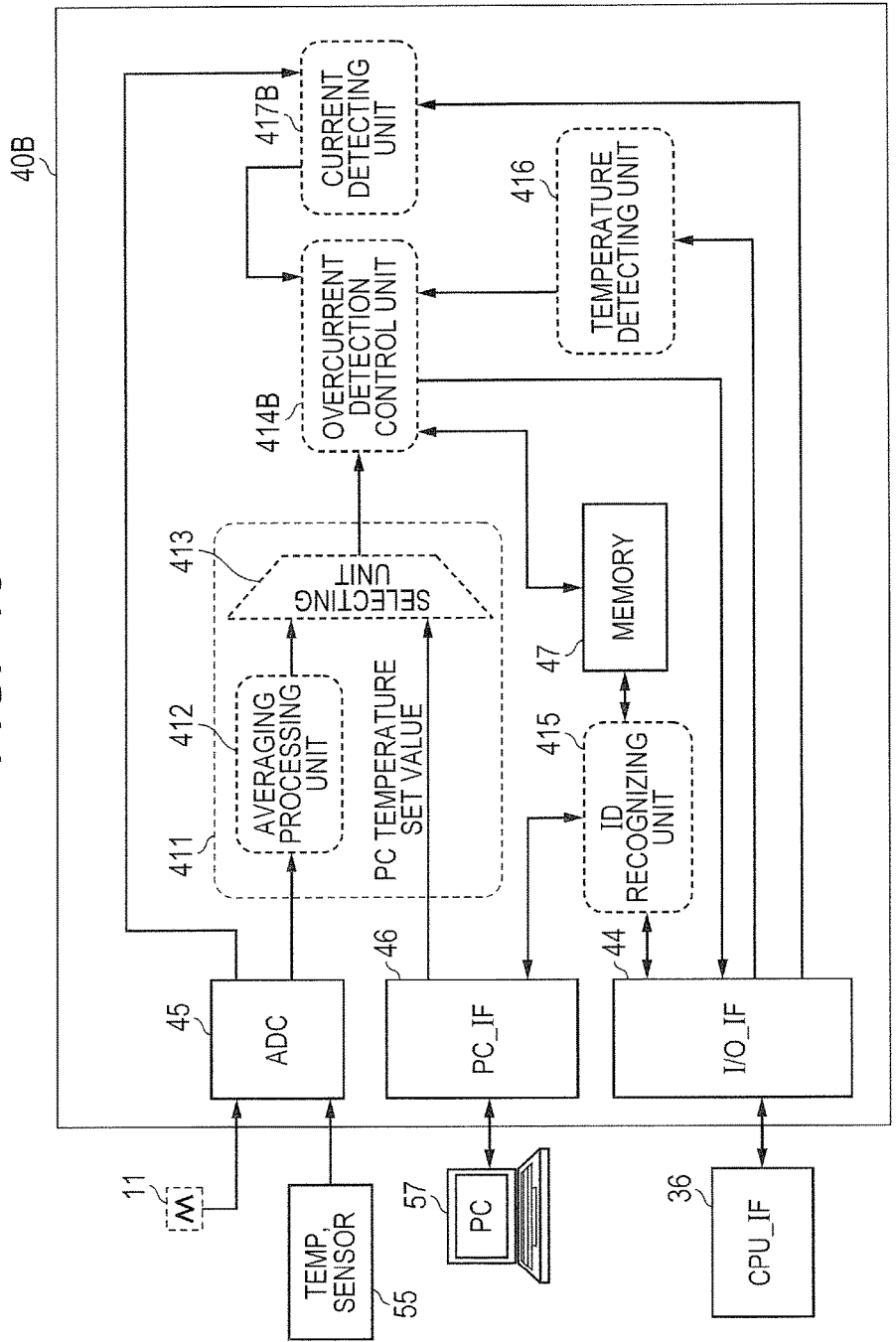
FIG. 19 is a block diagram illustrating functions of a control circuit in FIG. 17.

FIG. 19 is a block diagram illustrating functions of the control circuit in FIG. 17. The control circuit 40B has an overcurrent detection control unit 414B and a current detecting unit 417B obtained by adding more functions to the overcurrent detection control unit 414 and the current detecting unit 417 in the control circuit 40 of the first example. To the overcurrent detection control unit 414B, a function of generating a signal for controlling the drive voltage control circuit 312 of the drive circuit 31B is added. To the current detecting unit 417B, a function of calculating the current mirror ratio (γ) from the drive current (Id) and the current mirror current (Iγ) measured is added.

Figure 20:
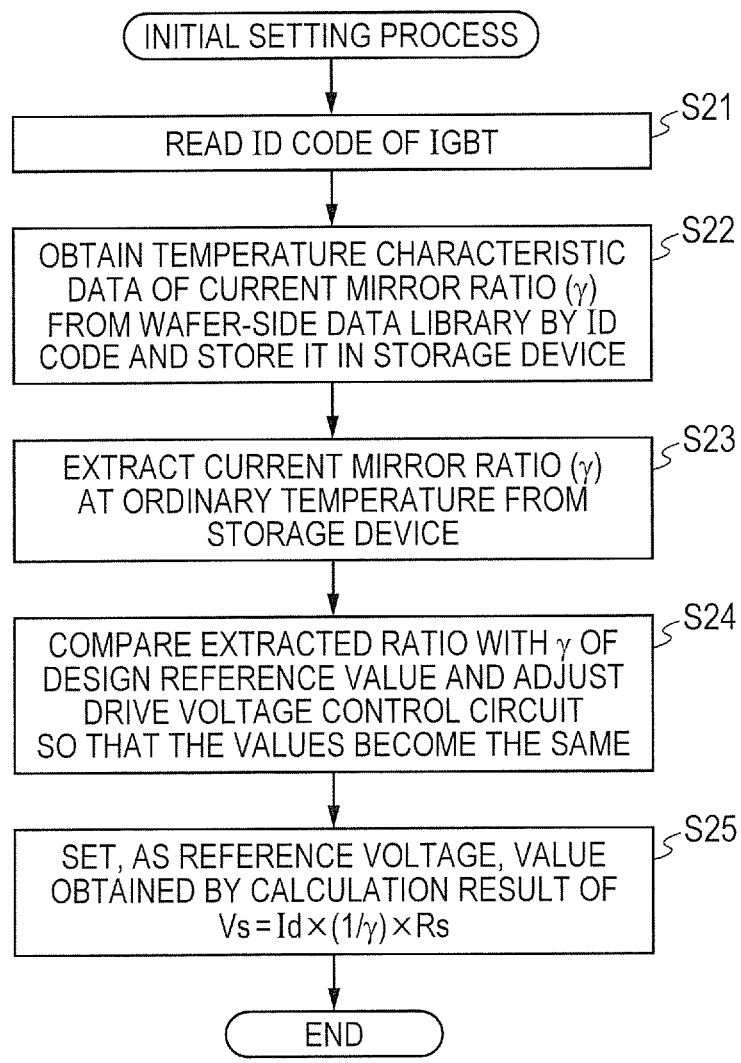
FIG. 20 is a flowchart illustrating the initial setting process at the time of manufacturing the electronic device of FIG. 17.

FIG. 20 is a flowchart illustrating the initial setting process at the time of manufacturing the electronic device according to the second modification.

First, the ID recognizing unit 415 reads the ID code of the power semiconductor device 21 (step S21). Next, the ID recognizing unit 415 obtains the temperature characteristic data of the current mirror ratio (γ) from the external storage device 56 in which the wafer measurement data library is stored by the ID code and stores it into the memory device 47 (step S22). The overcurrent detection control unit 414B extracts the current mirror ratio (γ) at the time of ordinary temperature from the memory device 47 (step S23). When the extracted current mirror ratio (γ) and the current mirror ratio (γ) of the design reference value are compared and different, the overcurrent detection control unit 414B adjusts the drive voltage control circuit 312 so that the current mirror ratio (γ) measured by the current detecting unit 417B and the current mirror ratio (γ) of the design reference value become the same value (step S24). The overcurrent detection control unit 414B sets the voltage value obtained by the calculation result of the equation (1) in the reference voltage generation circuit 322 (step S25). The reference voltage changing process and the drive current checking process in the normal operation of the second modification are similar to those of the first example.

According to the second modification, the current mirror ratio can be set close to the design reference value, so that overcurrent can be detected with higher precision as compared with the first example.

In place of the temperature detection diode D1 of the second modification, the thermistor 58 may be used in a manner similar to the first modification.

Third Modification

In the first example and the first and second modifications, the power semiconductor device stores the ID code and the device characteristic of the power semiconductor device is stored as a wafer measurement data library in the external storage device 56. In a third modification (modification 3) of the first example, the device characteristic of the power semiconductor device is stored in the power semiconductor device itself.

Figure 21:
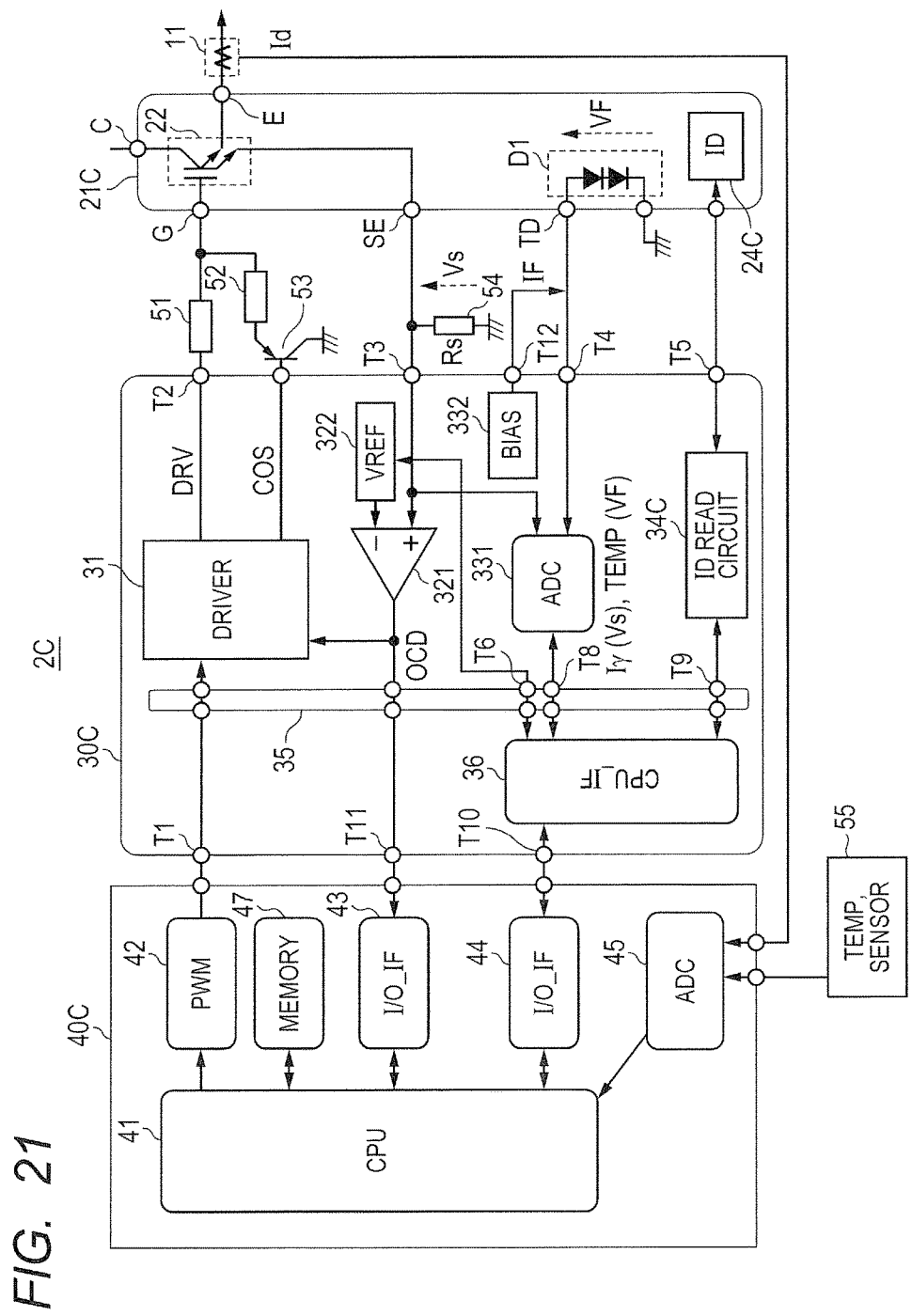
FIG. 21 is a block diagram illustrating the configuration of an electronic device according to a third modification.

FIG. 21 is a block diagram illustrating the configuration of an electronic device according to the third modification. The electronic device according to the third modification is similar to that of the first example except for the ID circuit of the power semiconductor device, the ID read circuit of the driver IC, and its control. The point different from the first example will be mainly described. An electronic device 2C has a power semiconductor device 21C, a driver IC 30C, and a control circuit 40C. The power semiconductor device 21C has an ID circuit 24C storing the device characteristic of the power semiconductor device. In a wafer test at the time of ware manufacture of the power semiconductor device 21C, an ordinary-temperature test and a high-temperature test are executed and characteristic data (temperature characteristic of the current mirror ratio (γ)) of the power semiconductor device 21C obtained at the time of execution is stored in the ID circuit 24C. In the wafer test, characteristic data is set by, for example, disconnecting an electric fuse of the ID circuit 24C in the power semiconductor device 21C. The driver IC 30C has an ID read circuit 34C reading data in the ID circuit 24C. Like the ID read circuit 34 of the first example, the ID read circuit 34C is comprised of an A/D conversion circuit or the like.

Figure 22:
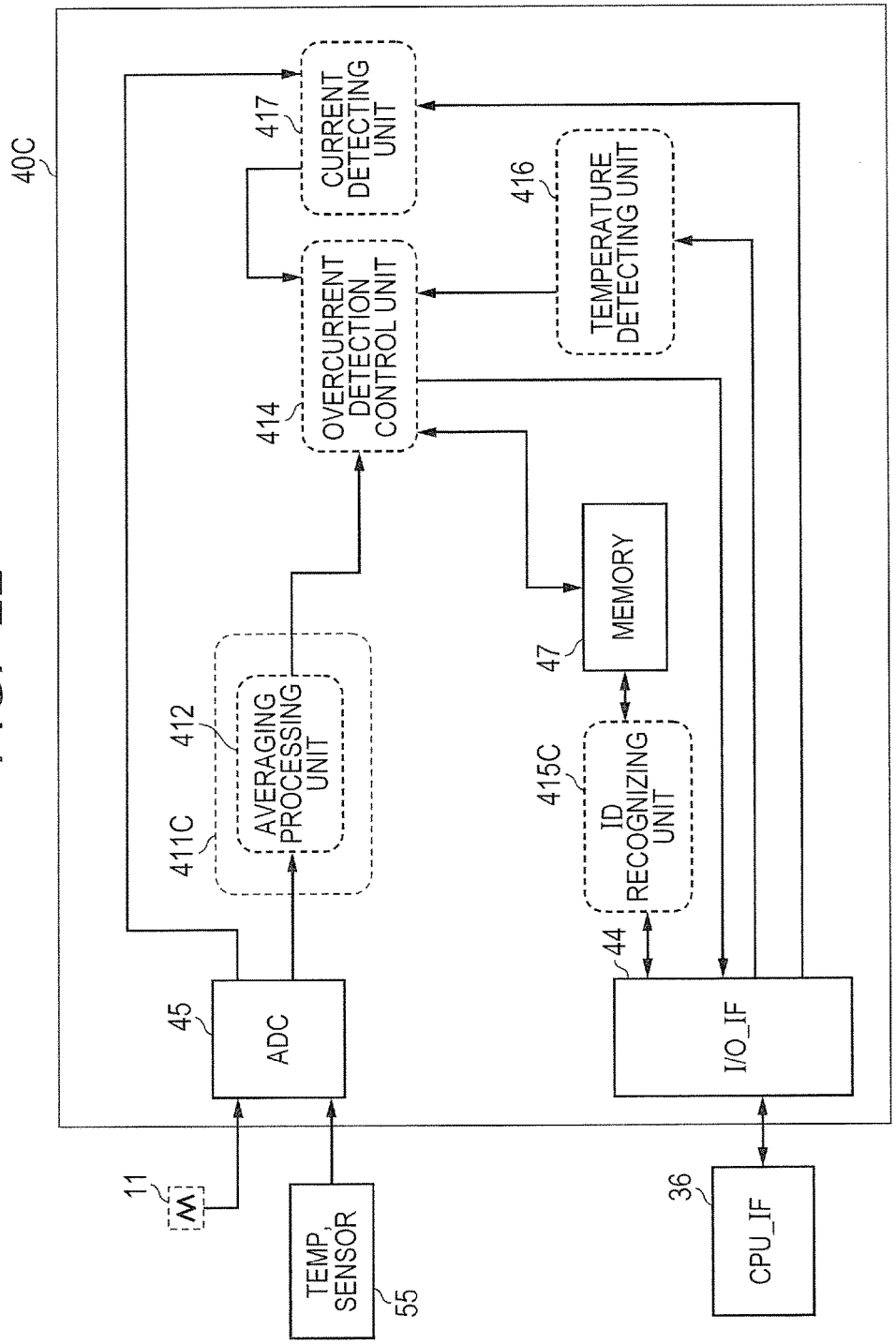
FIG. 22 is a block diagram illustrating functions of a control circuit in FIG. 21.

FIG. 22 is a block diagram illustrating functions of the control circuit in FIG. 21. The control circuit 40C is similar to the control circuit 40 of the first example except that it does not have the PC interface 46, an outside-air-temperature detecting unit 411C does not have the selecting unit 413, and an ID recognizing unit 415C reading the temperature characteristic data of the current mirror ratio (γ) is provided in place of the ID recognizing unit 415 for reading the ID code.

Figure 23:
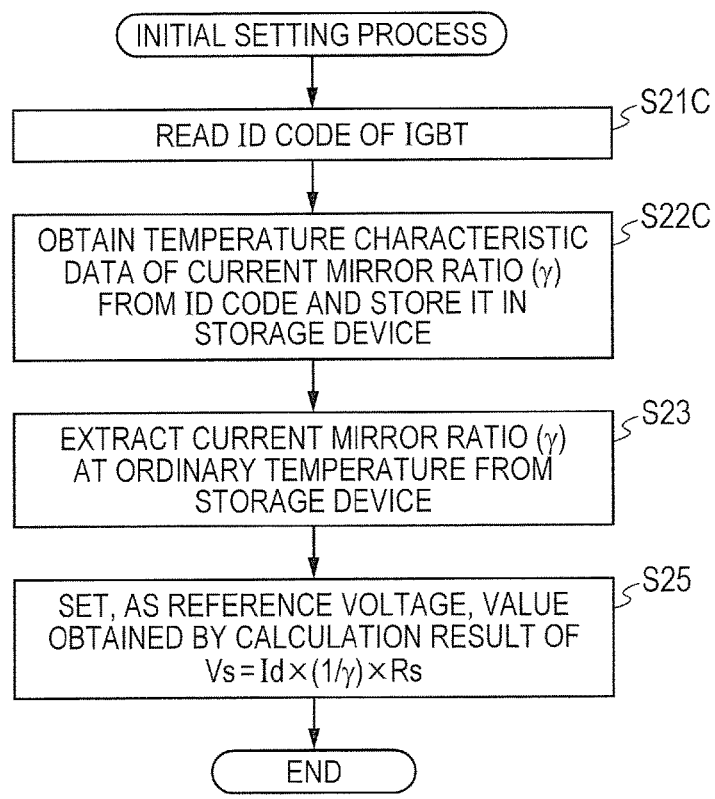
FIG. 23 is a flowchart illustrating the initial setting process at the time of manufacturing the electronic device in FIG. 21.

FIG. 23 is a flowchart illustrating the initial setting process at the time of manufacturing the electronic device according to the third modification.

First, the ID recognizing unit 415C reads the ID code of the power semiconductor device 21 (step S21C). The ID code includes the temperature characteristic of the current mirror ratio (γ). Next, the ID recognizing unit 415 obtains the temperature characteristic data of the current mirror ratio (γ) included in the ID code and stores it into the memory device 47 (step S22C). The overcurrent detection control unit 414 extracts the current mirror ratio (γ) at the time of ordinary temperature (step S23). The overcurrent detection control unit 414 sets a voltage value obtained by a calculation result of the equation (1) in the reference voltage generation circuit 322 (step S25). The reference voltage changing process and the drive current checking process in the normal operation of the third modification are similar to those of the first example.

In the third modification, it is unnecessary to separately provide a wafer measurement data library and there is no coupling to an external PC. Therefore, the initialization setting process can be made simpler than that of the first example.

In place of the temperature detection diode of the third modification, the thermistor 58 may be used in a manner similar to the first modification. In a manner similar to the second modification, the drive circuit of the third modification may be provided with the drive voltage control circuit 312, and the overcurrent detection control unit of the control circuit may perform the control.

Second Example

In a second example (example 2) of a second embodiment, temperature characteristic data of the current mirror ratio (γ) in the power semiconductor device is measured, and the temperature characteristic data of the current mirror ratio (γ) is held in another semiconductor integrated circuit device different from the semiconductor integrated circuit device which detects overcurrent.

Figure 24:
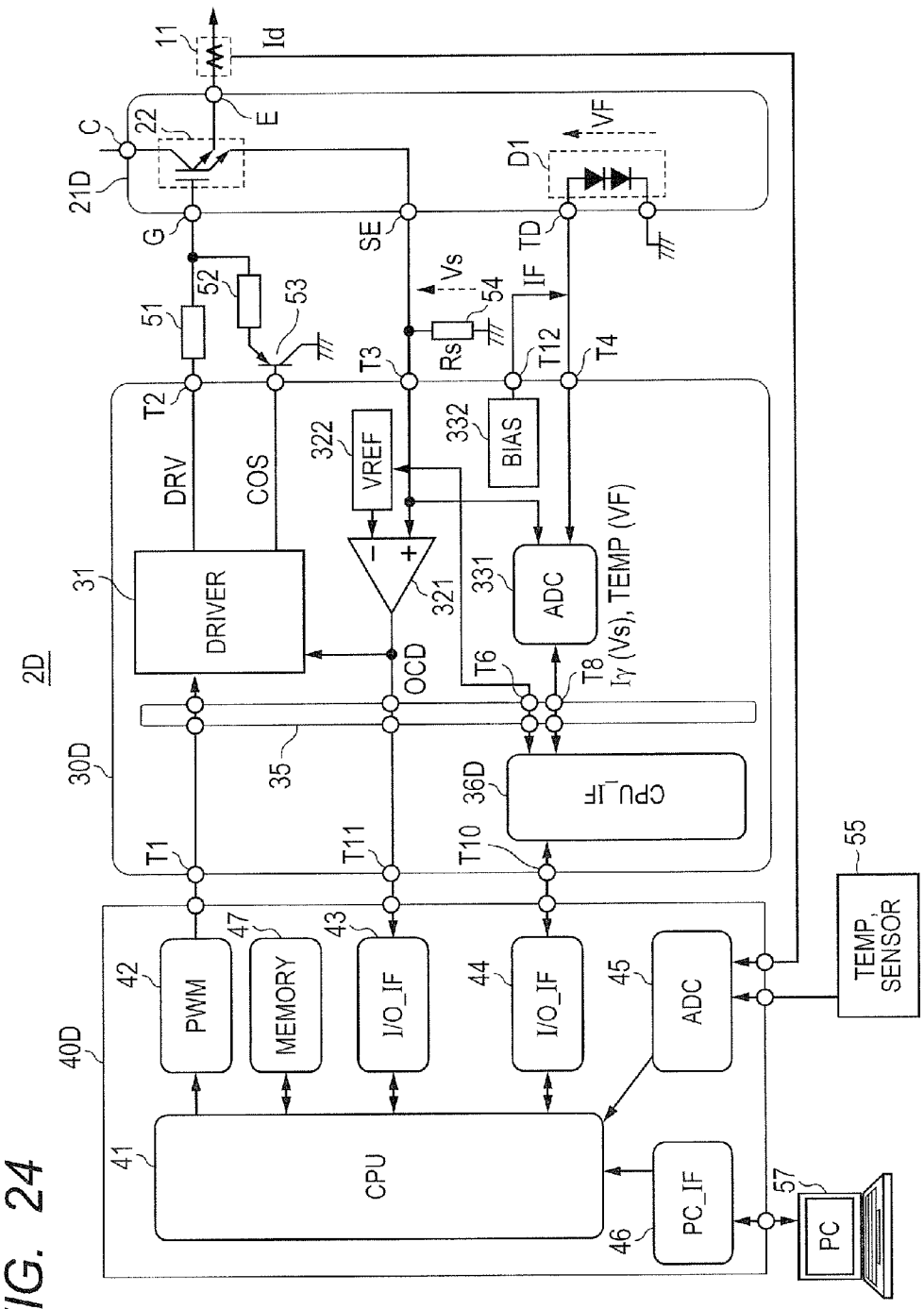
FIG. 24 is a block diagram illustrating the configuration of an electronic device according to a second example.

FIG. 24 is a block diagram illustrating the configuration of an electronic device according to the second example. An electronic device 2D according to the second example is similar to that of the first example except that the power semiconductor device does not have an ID circuit, the driver IC does not have an ID read circuit, and the control circuit does not have an ID recognizing unit. The electronic device 2D is used in the electric motor system 1 in place of the electronic device 2. The point different from the first example will be mainly described.

Figure 25:
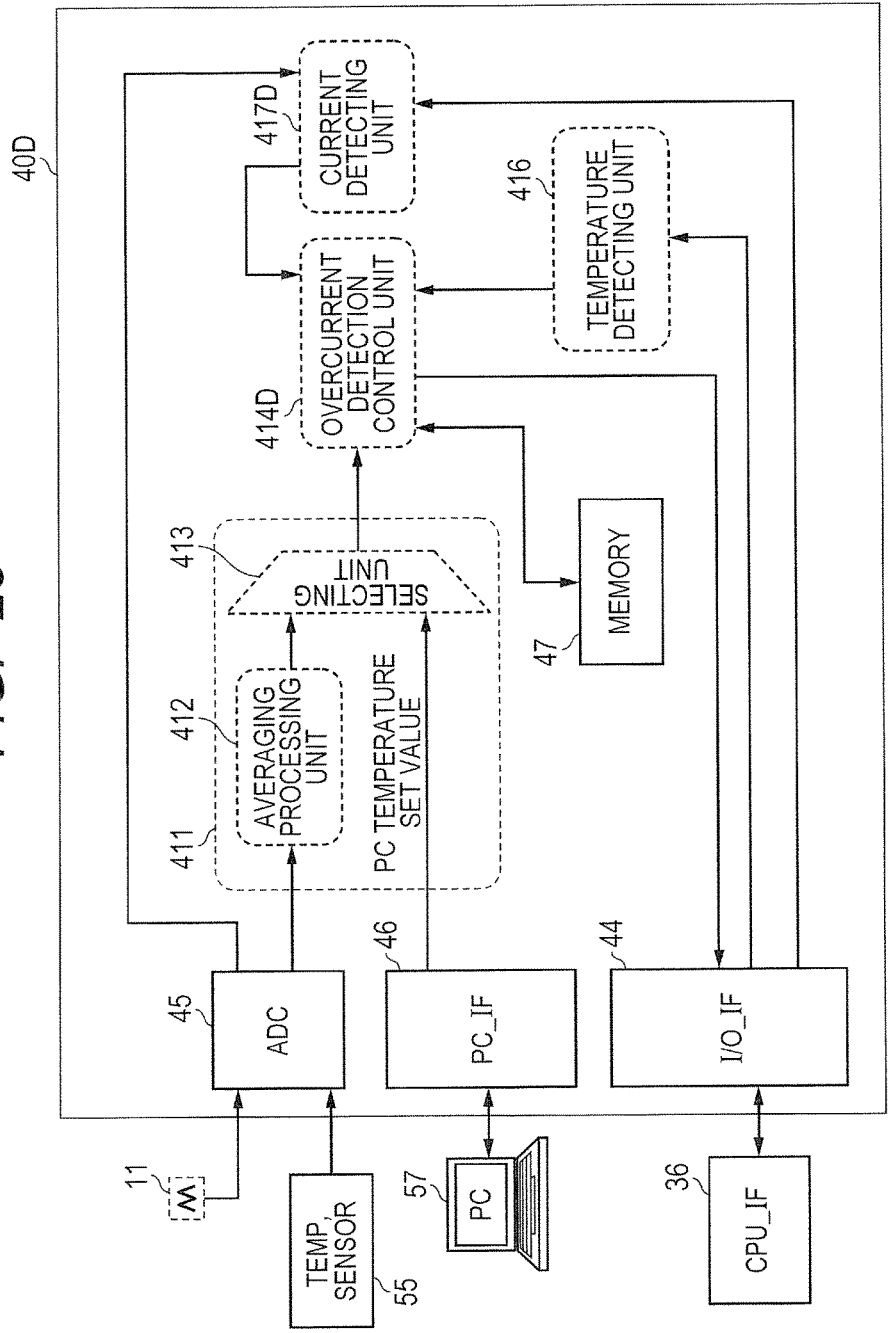
FIG. 25 is a block diagram illustrating functions of a control circuit in FIG. 24.

FIG. 25 is a block diagram illustrating functions of the control circuit in FIG. 24. A control circuit 40D does not have the ID recognizing unit 415 but has an overcurrent detection control unit 414D and a current detecting unit 417D whose functions are changed from the functions of the overcurrent detection control unit 414 and the current detection unit 417 in the control circuit 40 of the first example. The overcurrent detection control unit 414D has a function of storing the current mirror ratio (γ) calculated by the current detecting unit into the memory device 47. The current detecting unit 417D has a function of calculating the current mirror ratio (γ) from the drive current (Id) and the current mirror current (Iγ) measured. Since it is sufficient to detect the ambient temperature by either the outside-air-temperature detector 55 or the PC 57, one of the outside-air-temperature detector 55 and the PC 57 may not be provided. In this case, the selecting unit 413 in the outside-air-temperature detecting unit 411 may not be provided. In the case of detecting the ambient temperature by the PC 57, the averaging processing unit 412 may not be provided.

Figure 26:
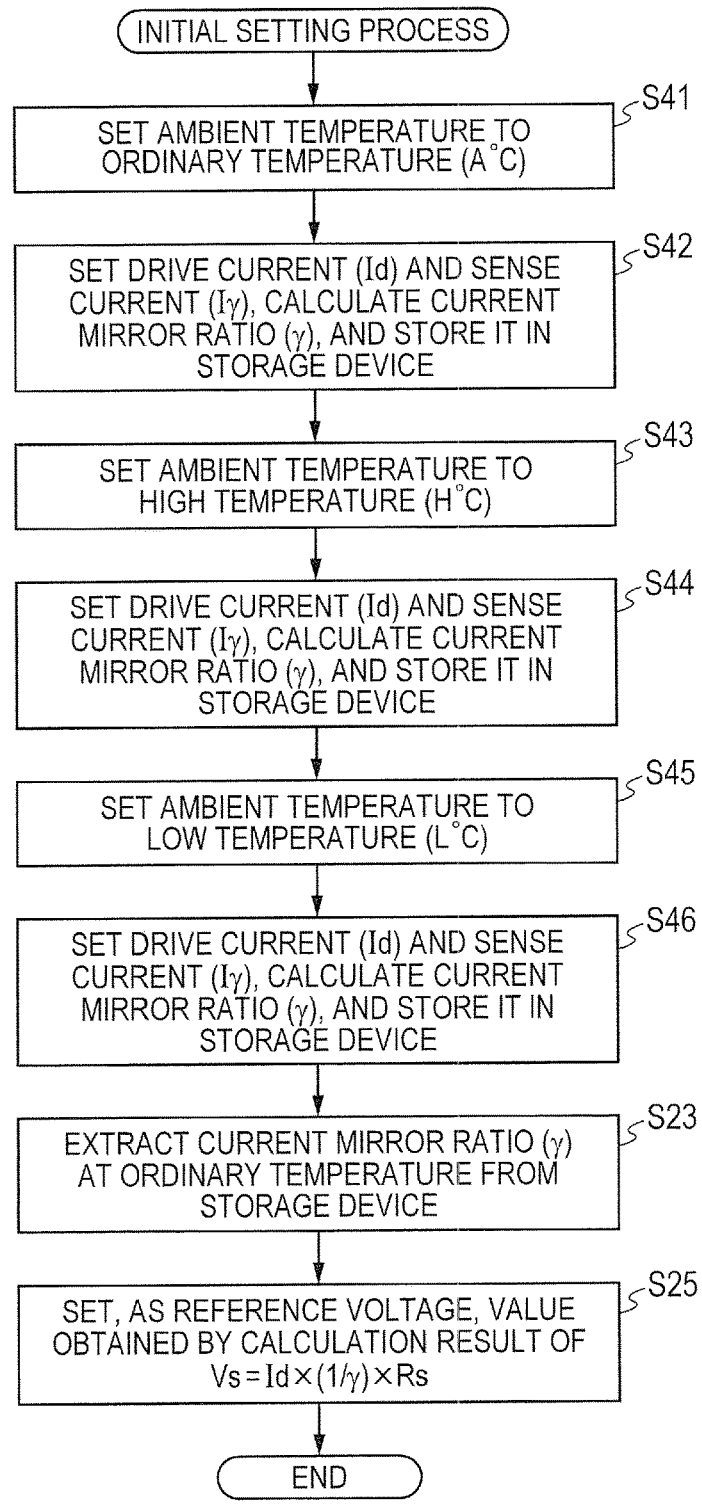
FIG. 26 is a flowchart illustrating the initial setting process at the time of manufacturing the electronic device of FIG. 24.

FIG. 26 is a flowchart illustrating the initial setting process at the time of manufacturing the electronic device according to the second example.

First, the ambient temperature is set to ordinary temperature (A ° C.) (step S41). The current detecting unit 417D measures the drive current (Id) and sense current (Iγ) and calculates current mirror ratio (γ). The overcurrent detection control unit 414D stores the calculated current mirror ratio (γ) into the storage device (step S42). The ambient temperature is set to high temperature (H ° C.) (step S43). The current detecting unit 417D measures the drive current (Id) and sense current (Iγ) and calculates the current mirror ratio (γ). The overcurrent detection control unit 414D stores the calculated current mirror ratio (γ) into the storage device (step S44). The ambient temperature is set to low temperature (L ° C.) (step S45). The current detecting unit 417D measures the drive current (Id) and sense current (Iγ) and calculates the current mirror ratio (γ). The overcurrent detection control unit 414D stores the calculated current mirror ratio (γ) into the storage device (step S46). Next, the overcurrent detection control unit 414D extracts the current mirror ratio (γ) at ordinary temperature from the memory device 47 (step S23). The overcurrent detection control unit 414D sets the voltage value obtained by the calculation result of the equation (1) in the reference voltage generation circuit 322 (step S25). The reference voltage changing process and the drive current checking process in the normal operation of the second example are similar to those in the first example.

In the second example, it is unnecessary to provide an ID circuit in each power semiconductor device. Consequently, even in the case where there is a limitation in a mounting condition such as a limitation in the number of bonding wires per power semiconductor device, the temperature characteristic of the current mirror ratio can be obtained.

In place of the temperature detection diode of the second example, the thermistor 58 may be used in a manner similar to the first modification. The drive circuit of the second example may be provided with the drive voltage control circuit 312 in a manner similar to the second modification, and control can be performed by the overcurrent detection control unit of the control circuit.

Although the invention achieved by the inventors of the present invention has been concretely described on the basis of the embodiments, examples, and modifications, obviously, the present invention is not limited to the embodiments, example, and modifications and can be variously changed.

Embodiments will be supplementarily described below.

Supplemental Note 1

1. A method of manufacturing an electronic device includes:
(a) a step of providing a power semiconductor device having a switching element, a terminal outputting drive current, and a terminal outputting sense current, a first semiconductor integrated circuit device having a gate circuit driving the switching element, and a second semiconductor integrated circuit device having a control unit controlling the gate circuit and an electrically rewritable nonvolatile memory; and
(b) a step of obtaining a temperature characteristic of a current mirror ratio of the power semiconductor device.

Supplemental Note 2

In the method of manufacturing the electronic device of the supplemental note 1, the step (b) includes:
(b1) a step of detecting temperature of a first temperature environment and storing it in a nonvolatile memory;
(b2) a step of detecting the current mirror ratio in the first temperature environment and storing it in the nonvolatile memory;
(b3) a step of detecting temperature of a second temperature environment;
(b4) a step of detecting the current mirror ratio in the second temperature environment; and
(b5) a step of obtaining a temperature characteristic on the basis of the temperatures and the current mirror ratios obtained in the steps (b1) to (b4) and storing them in the nonvolatile memory.

Supplemental Note 3

In the method of manufacturing the electronic device of the supplemental note 1, the step (b) includes:
(b1) a step of recognizing identification information of the power semiconductor device from the power semiconductor device; and
(b2) a step of obtaining a temperature characteristic of a current mirror ratio corresponding to the identification information from an external database and storing it in the nonvolatile memory.

Supplemental Note 4

In the method of manufacturing the electronic device of the supplemental note 3,
the temperature characteristic data of the current mirror ratio is obtained by a wafer test at the time of manufacturing the power semiconductor device.

Supplemental Note 5

In the method of manufacturing the electronic device of the supplemental note 1, the step (b) includes:
(b1) a step of obtaining a temperature characteristic of a current mirror ratio from the power semiconductor device; and (b2) a step of storing the obtained temperature characteristic of the current mirror ratio into the nonvolatile memory.

What is claimed is:

1. An electronic device comprising:
a power semiconductor device;
a first semiconductor integrated circuit device driving the power semiconductor device; and
a second semiconductor integrated circuit device controlling the first semiconductor integrated circuit device,
wherein the power semiconductor device comprises:
a terminal outputting drive current; and
a terminal outputting sense current,
wherein the first semiconductor integrated circuit device comprises:
a drive circuit driving the power semiconductor device;
an overcurrent detection circuit detecting overcurrent on the basis of the sense current; and
a temperature detection circuit detecting temperature of the power semiconductor device, and
wherein the second semiconductor integrated circuit device comprises:
a storage device storing a temperature characteristic of a current mirror ratio of the power semiconductor device;
a temperature detecting unit calculating temperature on the basis of an output of the temperature detection circuit; and
an overcurrent detection control unit controlling the overcurrent detection circuit on the basis of the temperature detected by the temperature detecting unit and the temperature characteristic of the current mirror ratio stored in the storage device.

2. The electronic device according to claim 1, wherein the power semiconductor device comprises an ID circuit having an ID code of the power semiconductor device,
wherein the first semiconductor integrated circuit device has an ID read circuit reading the ID code from the ID circuit,
wherein the second semiconductor integrated circuit device has an ID recognizing unit recognizing the ID code from the ID read circuit, and
wherein the temperature characteristic obtained by a wafer test at the time of manufacturing the power semiconductor device on the basis of the ID code is stored in the storage device.

3. The electronic device according to claim 2, wherein the second semiconductor integrated circuit device has a PC interface for storing a temperature characteristic of the current mirror ratio to be stored in an external storage device into the storage device.

4. The electronic device according to claim 2, wherein the temperature characteristic of the current mirror ratio is included in the ID code.

5. The electronic device according to claim 1,
wherein the first semiconductor integrated circuit device has a circuit detecting sense current and
wherein the second semiconductor integrated circuit device has a current detecting unit obtaining drive current of the power semiconductor device and the sense current.

6. The electronic device according to claim 5,
wherein the drive circuit has a drive voltage control circuit controlling drive voltage and
wherein the overcurrent detection control unit controls the drive voltage control circuit on the basis of the drive current and the sense current detected by the current detecting unit.

7. The electronic device according to claim 5, wherein the overcurrent detection control unit calculates a current mirror ratio on the basis of the drive current and the sense current detected by the current detecting unit and stores it into the storage device.

8. The electronic device according to claim 1, wherein the second semiconductor integrated circuit device has a CPU and a memory storing a program.

9. The electronic device according to claim 8, wherein the storage device and the memory are flash memories.

10. The electronic device according to claim 1, wherein the drive circuit stops or suppresses driving on the basis of a signal from the overcurrent detection circuit.

11. A semiconductor integrated circuit device comprising:
a first terminal for inputting a signal from another semiconductor integrated circuit device;
a second terminal to be coupled to a gate terminal of a power semiconductor device;
a third terminal to be coupled to a sense current terminal and a current detection resistor in the power semiconductor device;
a comparator coupled to the third terminal;
a reference voltage generation circuit coupled to the comparator;
a drive circuit outputting a drive signal based on the signal and an output of the comparator to the second terminal;
a fourth terminal for inputting temperature information of the power semiconductor device;
a fifth terminal for inputting information related to a temperature characteristic of a current mirror ratio of the power semiconductor device from the power semiconductor device;
a conversion circuit converting the temperature information to first data;
a conversion circuit converting the information to second data; and
a sixth terminal for inputting information controlling voltage of the reference voltage generation circuit based on the first data and the second data.

12. The semiconductor integrated circuit device according to claim 11, further comprising a current bias circuit coupled to the fourth terminal,
wherein the fourth terminal is coupled to an anode terminal of a temperature detection diode provided in the power semiconductor device.

13. The semiconductor integrated circuit device according to claim 11, further comprising a current bias circuit coupled to the fourth terminal,
wherein the fourth terminal is coupled to a thermistor mounted over the power semiconductor device.

14. The semiconductor integrated circuit device according to claim 11, wherein the fifth terminal is coupled to a terminal for inputting an ID number provided in the power semiconductor device.

15. The semiconductor integrated circuit device according to claim 11, wherein the fifth terminal is coupled to a terminal for inputting temperature characteristic data of a current mirror ratio provided in the power semiconductor device.

16. The semiconductor integrated circuit device according to claim 11,
wherein the drive circuit comprises a voltage control circuit controlling drive voltage and
wherein a seventh terminal for inputting information controlling the voltage control circuit on the basis of the first data and the second data is provided.

17. The semiconductor integrated circuit device according to claim 11, further comprising:
an eighth terminal for outputting the first data;
a ninth terminal for outputting the second data;
a tenth terminal to be coupled to the another semiconductor integrated circuit device; and
an interface circuit coupling the sixth, eighth, and ninth terminals and the tenth terminal.

18. The semiconductor integrated circuit device according to claim 16, further comprising:
a tenth terminal to be coupled to the another semiconductor integrated circuit device; and
an interface circuit coupling the seventh terminal and the tenth terminal.

19. The semiconductor integrated circuit device according to claim 11, further comprising an eleventh terminal for outputting an output of the comparator to the another semiconductor integrated circuit device.

20. A semiconductor integrated circuit device comprising:
a first terminal for inputting a signal from another semiconductor integrated circuit device;
a second terminal to be coupled to a gate terminal of a power semiconductor device;
a third terminal to be coupled to a sense current terminal and a current detection resistor in the power semiconductor device;
a comparator coupled to the third terminal;
a reference voltage generation circuit coupled to the comparator;
a drive circuit outputting a drive signal based on the signal and an output of the comparator to the second terminal;
a fourth terminal for inputting temperature information of the power semiconductor device;
a conversion circuit converting the temperature information to first data;
a conversion circuit converting voltage of the third terminal to second data; and
a sixth terminal for inputting information controlling voltage of the reference voltage generation circuit on the basis of the first data, the second data, and data of a current transformer detecting drive current as an output of the power semiconductor device.

* * * * *